United States Patent [19]
Yamaguchi et al.

[11] Patent Number: 5,977,615
[45] Date of Patent: Nov. 2, 1999

[54] LEAD FRAME, METHOD OF MANUFACTURING LEAD FRAME, SEMICONDUCTOR DEVICE AND METHOD OF MANUFACTURING SEMICONDUCTOR DEVICE

[75] Inventors: Yukio Yamaguchi; Akira Oga, both of Shiga; Toru Nomura, Hyogo; Masanori Minamio, Osaka, all of Japan

[73] Assignee: Matsushita Electronics Corporation, Osaka, Japan

[21] Appl. No.: 08/997,651

[22] Filed: Dec. 23, 1997

[30] Foreign Application Priority Data

Dec. 24, 1996 [JP] Japan ................................. 8-342997

[51] Int. Cl.$^6$ .......................... H01L 23/495; H01L 23/28
[52] U.S. Cl. .......................... 257/666; 257/672; 257/787; 257/674; 361/813
[58] Field of Search ................................. 257/666, 670, 257/671, 672, 674, 787, 690, 692, 783; 438/123; 361/813

[56] References Cited

U.S. PATENT DOCUMENTS

| | | | |
|---|---|---|---|
| 5,214,307 | 5/1993 | Davis | 257/666 |
| 5,332,864 | 7/1994 | Liang et al. | 257/666 |
| 5,457,341 | 10/1995 | West | 257/666 |
| 5,610,437 | 3/1997 | Frechette | 257/666 |
| 5,637,913 | 6/1997 | Kajihara et al. | 257/666 |
| 5,834,837 | 11/1998 | Song | 257/692 |

FOREIGN PATENT DOCUMENTS 0 582 052  2/1994  European Pat. Off. .............. 257/693

*Primary Examiner*—Mahshid Saadat
*Assistant Examiner*—Jhihan B. Clark
*Attorney, Agent, or Firm*—McDermott, Will & Emery

[57] ABSTRACT

In a lead frame, inside inner leads are supported by supporting leads through an insulator. The inside inner leads and outside inner leads are separated from one another and are doubly arranged. In manufacturing a semiconductor device by using this lead frame, a semiconductor chip is mounted on the insulator, and the semiconductor chip is connected with the inside inner leads and the outside inner leads through metal wires, and the resultant is sealed with a resin. Thus, projections provided on the bottoms of the inside inner leads and the outside inner leads can work as external terminals. Since the external terminals can be disposed two-dimensionally on the bottom, the lead frame is applicable to high density packaging and multi-pin devices, and can additionally provide a so-called burr-less structure free from uncut waste of the resin.

27 Claims, 29 Drawing Sheets

LEAD FRAME, METHOD OF MANUFACTURING LEAD FRAME, SEMICONDUCTOR DEVICE AND METHOD OF MANUFACTURING SEMICONDUCTOR DEVICE

BACKGROUND OF THE INVENTION

The present invention relates to a lead frame for a semiconductor device mounting a semiconductor chip such as a semiconductor integrated circuit chip and a transistor, a method of manufacturing the lead frame, a semiconductor device and a method of manufacturing the semiconductor device. More particularly, it relates to improvement in reliability and application to multi-pin devices.

A conventional lead frame will be described with reference to drawings.

FIG. 27 is a plan view for showing the structure of the conventional lead frame. As is shown in FIG. 27, the conventional lead frame includes a rectangular outer frame 110; a rectangular die pad 101 disposed at substantially the center of an area surrounded with the outer frame 110 for mounting a semiconductor chip; first inner leads 102, second inner leads 103, third inner leads 104 and fourth inner leads 105 electrically connected with the semiconductor chip mounted on the die pad 101 through connecting means such as metal wires; first outer leads 106, second outer leads 107, third outer leads 108 and fourth outer leads 109 respectively formed continuous with the first inner leads 102, the second inner leads 103, the third inner leads 104 and the fourth inner leads 105 for connection with external terminals; a dam bar 111 for connecting and fixing the first outer leads 106, the second outer leads 107, the third outer leads 108 and the fourth outer leads 109; and tie-bars 113 for connecting the corners of the outer frame 110 with the corresponding corners of the die pad 101. In this manner, the die pad 101 is supported by the tie-bars 113 in the conventional lead frame.

The conventional lead frame is manufactured through procedures as is shown in FIGS. 28(a) and 28(b). FIGS. 28(a) and 28(b) are partial plan views for showing the manufacturing procedures for the conventional lead frame, wherein merely the upper right portion of the lead frame is shown.

First, as is shown in FIG. 28(a), a metal plate 114 is etched or pressed, thereby forming, in the metal plate 114, the die pad 101, the tie-bars 113, the inner leads 102 through 105 (among which the inner leads 103 and 104 are not shown) connected with the die pad 101, the outer leads 106 through 109 (among which the outer leads 107 and 108 are not shown) formed continuous with the inner leads 102 through 105 for connection with external terminals, the outer frame 110, and the dam bar 111 for connecting and fixing the outer leads 106 through 109. Thus, a lead frame body 115 is formed. At this point, every two inner leads are connected with each other at their tips among the inner leads 102 through 105.

Then, as is shown in FIG. 28(b), the tips of the inner leads 102 through 105 of the frame body 115 are cut off (a tip cutting procedure), so that the inner leads 102 through 105 can be separated from the die pad 101 and independent of one another. After the procedure shown in FIG. 28(a) and before the procedure shown in FIG. 28(b), a plating procedure for plating the lead frame body 115 can be carried out. In the procedure shown in FIG. 28(b), since every two inner leads are connected with each other among the inner leads 102 through 105 in the previous procedure, the connected tips are cut off.

Next, a semiconductor device using the conventional lead frame will be described. FIG. 29 is a plan view of a conventional semiconductor device, and FIG. 30 is a sectional view taken on line XXX—XXX of FIG. 29.

As is shown in FIGS. 29 and 30, a semiconductor chip 116 is bonded onto the die pad 101 supported by the tie-bars 113, and the first inner leads 102, the second inner leads 103, the third inner leads 104 and the fourth inner leads 105 are disposed in the vicinity of respective sides of the semiconductor chip 116, namely, a first side 116a, a second side 116b, a third side 116c and a fourth side 116d, respectively. Electrode pads 117 of the semiconductor chip 116 are electrically connected with the inner leads 102, 103, 104 and 105 through metal wires 118. Then, the semiconductor chip 116, the die pad 101, the tie-bars 113, the inner leads 102, 103, 104 and 105 and the metal wires 118 are sealed with a sealing resin 119, so that the first outer leads 106, the second outer leads 107, the third outer leads 108 and the fourth outer leads 109 can be protruded from the sealing resin 119. Ultimately, the dam bar 111 is cut off, the outer frame 110 is removed, and the outer leads 106, 107, 108 and 109 are formed into desired shapes. Thus, the semiconductor device is completed.

In the plan view of FIG. 29, the sealing resin 119 is shown as a transparent substance, and merely the outline thereof is shown.

However, the conventional lead frame and the conventional semiconductor device using the lead frame have the following problems:

First, when the lead frame is used for a semiconductor device, the outer leads are protruded from the side faces of the semiconductor device as external terminals. Therefore, there is a limit in compactness in the packaging area.

Second, even when the inner leads and the outer leads are formed with small pitches therebetween and a semiconductor chip having a large number of electrode pads is mounted, there is a limit in application to multi-pin devices. Actually, the applicable number of pins is limited to approximately 160.

Third, since the lead frame includes the dam bar, the procedure for cutting off the dam bar and forming the outer leads into desired shapes is indispensable after the resin sealing procedure in the manufacture of a semiconductor device. Therefore, there is also a limit in decreasing the manufacturing procedures for the semiconductor device.

SUMMARY OF THE INVENTION

The object of the invention is providing a lead frame, a method of manufacturing the lead frame, a semiconductor device and a method of manufacturing the semiconductor device, which can attain a compact packaging area, can be applied to multi-pin devices and can simplify manufacturing procedures, by adopting a structure of a lead frame suitable to disposing exposed external terminals on a bottom of a semiconductor device.

The lead frame of this invention for use in manufacturing a semiconductor device including a semiconductor chip comprises an outer frame; supporting leads connected with the outer frame; inside inner leads which are independent of one another, whose tips are disposed within or in the vicinity of an area for the semiconductor chip and whose ends are disposed at outside of the area for the semiconductor chip and are separated from the outer frame; and an insulator fixed on top faces of the supporting leads and the inside inner leads, wherein the inside inner leads are supported by the supporting leads through the insulator.

In this lead frame, the ends of the inside inner leads are separated from the outer frame. Therefore, in manufacturing a semiconductor device by using this lead frame, a cutting procedure for separating the inside inner leads from the outer frame is not required to be conducted after resin sealing. Specifically, the outer frame can be removed with ease by separating an outer frame from the supporting lead close to the outer frame. Accordingly, the resultant semiconductor device is free from burrs, which are formed on the side faces of the sealing resin through the conventionally required cutting procedure for the outer frame, and thus, a so-called burr-less semiconductor device having an accurate shape can be obtained. A "burr" herein means a rigid filler and the like of the sealing resin remaining without being cut and extending outward from the obtained package, and is an unnecessary part for the resin sealing. Also, external terminals can be two-dimensionally disposed by using the back faces of the inside inner leads as the external terminals, and hence, a high packaging density can be realized. Accordingly, a very compact burr-less semiconductor device can be provided.

Each of the inside inner leads is preferably provided, on a back face thereof, a projection to be used as an external terminal.

Thus, the external terminal is formed on the small projection. Therefore, the external terminals can be two-dimensionally variously disposed by providing ball electrodes on the projections or changing the arrangement of the projections.

The projections of the inside inner leads preferably have bottoms arranged in plural lines on a plane.

Thus, the external terminals can be two-dimensionally widely distributed while avoiding them from being too close to one another, and the resultant structure is suitable to high density packaging.

In one aspect, outside inner leads, whose tips are separated from the ends of the inside inner leads, can be disposed between the inside inner leads and the outer frame.

Thus, a larger number of external terminals can be two-dimensionally disposed by utilizing the back faces of the doubly arranged inner leads.

In another aspect, ends of the outside inner leads can be connected with the outer frame.

Alternatively, the ends of the outside inner leads can be separated from the outer frame, and the lead frame can be further provided with an outside insulator fixed on top faces of the supporting leads and the outside inner leads.

Thus, a burr-less semiconductor device with a high packaging density can be manufactured.

In still another aspect, the ends of the inside inner leads and the tips of the outside inner leads can be interposed between one another and disposed substantially alternately.

Thus, in manufacturing a semiconductor device, a distance between each electrode pad of the semiconductor chip and the end of each inside inner lead can be substantially equal to a distance between each electrode pad of the semiconductor chip and the tip of each outside inner lead. Therefore, a wire bonding procedure in the manufacture of the semiconductor device can be efficiently conducted.

In still another aspect, an area at inside of the tips of the inside inner leads can be open.

In this case, even when the area at inside of the inside inner leads is open, there is no problem in mounting a semiconductor chip in the manufacture of a semiconductor device because the lead frame includes the insulator fixed on the inside inner leads and the supporting leads. In addition, the open area can be used for providing various other members of the semiconductor device, and thus the degree of freedom in the structure of the semiconductor device can be increased.

In still another aspect, each of the supporting leads can extend from one portion of the outer frame to be connected with another portion of the outer frame.

Thus, the lead frame can attain a high resistance against solid twist and plane distortion of the outer frame.

In still another aspect, a die pad, which is set up against the inside inner leads, can be disposed at inside of the inside inner leads, and tips of the supporting leads can be connected with the die pad.

Thus, in the manufacture of a semiconductor device, a semiconductor chip can be mounted on the die pad of the lead frame regardless of the size of the semiconductor chip.

The method of manufacturing a lead frame for use in manufacturing a semiconductor device including a semiconductor chip of this invention comprises a first step of forming an outer frame, supporting leads connected with the outer frame and inside inner leads whose tips are connected with the supporting leads by selectively removing a metal plate for the lead frame; a second step of fixing an insulator on top faces of the supporting leads and the inside inner leads; and a third step of removing at least a connecting portion between the inside inner leads and the supporting leads by selectively removing the metal plate with the inside inner leads supported by the supporting leads through the insulator, wherein the inside inner leads are made to be separated from one another with tips thereof disposed within or in the vicinity of an area for the semiconductor chip and with ends thereof disposed at outside of the area for the semiconductor chip and separated from the outer frame.

In this method, after the insulator is fixed on the inside inner leads and the supporting leads in the second step, the connecting portion between the inside inner leads and the supporting leads is removed in the third step. Therefore, the inside inner leads are always supported by the outer frame no matter whether the ends of the inside inner leads are connected with the outer frame or not. As a result, the aforementioned structure of the lead frame can be easily realized.

The method can further comprises, after the first step, a step of forming a projection on a back face of each of the inside inner leads.

In this manner, the projections which are usable as external terminals can be formed in realizing the structure including the external terminals disposed on the bottom of the semiconductor device.

The step of forming the projections of the inside inner leads can be carried out after the first step by conducting half-etching on a back face of the metal plate with at least areas for the projections masked.

In this manner, the bottoms of the projections can accord with the back face of the metal plate, and hence, there is substantially no fluctuation in the height among the bottoms of the projections of the inside inner leads. Accordingly, in resin sealing in the manufacture of a semiconductor device by using this lead frame, the bottoms of the projections can be easily and definitely exposed out of a sealing resin.

The step of forming the projections of the inside inner leads can be carried out by pressing at the same time as or after the first step.

In this manner, the projections can be formed more easily and more rapidly than by the half-etching.

In the first step, outside inner leads connected with the outer frame can be formed between the inside inner leads and the outer frame, and after completing the third step, the outside inner leads can be made to have tips thereof disposed in the vicinity of but separated from the ends of the inside inner leads and have ends thereof connected with the outer frame.

In this manner, the lead frame including the doubly arranged inner leads can be manufactured with ease.

In the first step, a portion to be used as outside inner leads can be left in the metal plate between the inside inner leads and the outer frame; in the second step, an outside insulator can be fixed on top faces of the supporting leads and the portion to be used as the outside inner leads; in the third step, ends of the outside inner leads can be cut off from the outer frame; and after completing the third step, the outside inner leads can be made to have tips thereof disposed in the vicinity of but separated from the ends of the inside inner leads and have ends thereof separated from the outer frame.

Also in this manner, the lead frame including the doubly arranged inner leads can be easily manufactured. In addition, the ends of the outside inner leads are separated from the outer frame, a burr-less semiconductor device can be manufactured in the ultimate state.

The first semiconductor device of this invention comprises a semiconductor chip including electrode pads; inside inner leads which are separated from one another, whose tips are disposed within or in the vicinity of an area for the semiconductor chip and whose ends are disposed at outside of the area for the semiconductor chip; supporting leads for supporting the inside inner leads; an insulator fixed on top faces of the supporting leads and the inside inner leads; metal wires for electrically connecting the electrode pads of the semiconductor chip with the ends of the inside inner leads; and a sealing resin for sealing the semiconductor chip, the inside inner leads, the supporting leads, the insulator and the metal wires, wherein the ends of the inside inner leads are buried in the sealing resin and each of the supporting leads extends to a side face of the sealing resin, and at least a part of a back face of each of the inside inner leads is not covered with the sealing resin but exposed to work as an external terminal.

Thus, the external terminals can be two-dimensionally disposed on the bottom of the semiconductor device by utilizing the back faces of the inside inner leads, and the resultant semiconductor device can attain a high packaging density. Also, since the ends of the inside inner leads are buried in the sealing resin, a procedure for cutting off the outer frame is unnecessary, and hence, the semiconductor device can attain the burr-less structure.

A tip of each of the supporting leads can be cut off at a position at inside of a portion where the insulator is fixed, and the semiconductor chip can be mounted on the insulator.

Thus, the semiconductor device includes, at its center, an area where none of the members of the lead frame is present, and hence, this area can be utilized for separately providing other various members for the semiconductor device.

Each of the supporting leads can extend from one portion of the outer frame to be connected with another portion of the outer frame.

Thus, the strength of the lead frame can be increased, so that the respective members of the lead frame can be suppressed from deforming during the resin sealing in the manufacture of the semiconductor device.

A die pad, which is set up against the inside inner leads, can be formed at inside of the inside inner leads, tips of the supporting leads can be connected with the die pad, and the semiconductor chip can be mounted on the die pad.

Thus, the semiconductor chip can be definitely fixed even when the semiconductor chip is too small to be mounted on the insulator.

Each of the inside inner leads is preferably provided, on a back face thereof, with a projection, the exposed part of the back face of each of the inside inner leads corresponds to a bottom of the projection, and the projections of the inside inner leads preferably have the bottoms arranged in a plurality of lines on a plane.

Thus, the external terminals are arranged in the shape of a grid, and such two-dimensional arrangement of the external terminals leads to high density packaging and application to multi-pin devices.

The exposed bottoms of the projections are preferably provided with ball electrodes.

Thus, the resultant multi-pin semiconductor device with a high packaging density can be directly mounted on a mother substrate.

Outside inner leads whose tips are separated from the ends of the inside inner leads can be interposed between the inside inner leads and the outer frame, at least a part of a back face of each of the outside inner leads is not covered with the sealing resin but exposed, and the semiconductor device can be further provided with metal wires for electrically connecting the tips of the outside inner leads with the electrode pads of the semiconductor chip.

Thus, the inner leads can be doubly arranged, resulting in more efficiently attaining high density packaging and application to multi-pin devices.

The ends of the outside inner leads can be buried in the sealing resin, and the semiconductor device can be further provided with an outside insulator fixed on top faces of the supporting leads and the outside inner leads.

Thus, a burr-less semiconductor device including the doubly arranged inner leads can be provided.

However, the end of each of the outside inner leads can extend to a side face of the sealing resin.

The ends of the inside inner leads and the tips of the outside inner leads are preferably interposed between one another and disposed substantially alternately.

Thus, a distance between each electrode pad of the semiconductor chip and the end of each inside inner lead and a distance between each electrode pad of the semiconductor chip and the tip of each outside inner lead can be made substantially equal, and hence, the wire bonding procedure in the manufacture of the semiconductor device can be efficiently conducted.

The second semiconductor device of this invention comprises a semiconductor chip including electrode pads; inside inner leads which are separated from one another, whose tips are disposed within an area for the semiconductor chip and whose ends are disposed at outside of the area for the semiconductor chip; supporting leads for supporting the inside inner leads; metal wires for electrically connecting the electrode pads of the semiconductor chip with the ends of the inside inner leads; and a sealing resin for sealing the semiconductor chip, the inside inner leads, the supporting leads, the insulator and the metal wires, wherein the ends of the inside inner leads are buried in the sealing resin and each of the supporting leads extends to a side face of the sealing resin, at least a part of a back face of each of the inside inner leads is not covered with the sealing resin but exposed, and the semiconductor chip is mounted on a part of the inside inner leads excluding the ends thereof.

Thus, a semiconductor device which can exhibit the same effects as the first semiconductor device can be provided without using an insulator.

The first method of manufacturing a semiconductor device of this invention comprises a first step of preparing a lead frame including an outer frame, supporting leads connected with the outer frame, inside inner leads which are separated from one another, whose tips are disposed within or in the vicinity of an area for a semiconductor chip and whose ends are disposed at outside of the area for the semiconductor chip and separated from the outer frame, and an insulator fixed on top faces of the supporting leads and the inside inner leads; a second step of mounting the semiconductor chip on the lead frame; a third step of electrically connecting electrode pads of the semiconductor chip with the ends of the inside inner leads through metal wires; a fourth step of sealing, with a sealing resin, the lead frame excluding the outer frame, the semiconductor chip and the metal wires, with at least a part of a back face of each of the inside inner leads exposed; and a fifth step of removing the outer frame by cutting the lead frame.

In this manner, a burr-less multi-pin semiconductor device with a high packaging density can be obtained by using the lead frame of this invention. In the manufacture, a procedure for cutting off the outer frame is unnecessary, and there is no need to remove burrs (uncut waste of the resin) formed by cutting off the outer frame. Thus, the manufacture of a semiconductor device can be simplified.

In the first step, outside inner leads whose tips are separated from the ends of the inside inner leads can be interposed between the inside inner leads and the outer frame; in the third step, the tips of the outside inner leads can be electrically connected with the electrode pads of the semiconductor chip through metal wires; and in the fourth step, at least a part of a back face of each of the outside inner leads can be exposed.

In this manner, a multi-pin semiconductor device with a high packaging density including the doubly arranged inner leads can be provided.

In the first step, the ends of the inside inner leads and the tips of the outside inner leads can be interposed between one another and disposed substantially alternately, and the third step can be conducted so that a length of the metal wire for connecting between each of the electrode pads of the semiconductor chip and the end of each of the inside inner leads and a length of the metal wire for connecting each of the electrode pads of the semiconductor chip with the tip of each of the outside inner leads are substantially constant.

In this manner, the wire bonding procedure can be efficiently conducted.

The second method of manufacturing a semiconductor device of this invention comprises a first step of preparing a lead frame including an outer frame, supporting leads connected with the outer frame, and inside inner leads whose tips are connected with the supporting leads and whose ends are separated from the outer frame and disposed at outside of an area for a semiconductor chip; a second step of mounting the semiconductor chip on the lead frame; a third step of electrically connecting electrode pads of the semiconductor chip with the ends of the inside inner leads through metal wires; a fourth step of sealing, with a sealing resin, the lead frame excluding the outer frame, the semiconductor chip and the metal wires, with at least a part of a back face of each of the inside inner leads and a back face of a connecting portion between the tips of the inside inner leads and the supporting leads exposed; a fifth step of cutting off the inside inner leads from the supporting leads and separating the inside inner leads from one another by removing the connecting portion between the tips of the inside inner leads and the supporting leads which is exposed out of the sealing resin after the fourth step; and a sixth step of removing the outer frame by cutting the lead frame.

In this manner, the connecting portion between the tips of the inside inner leads and the supporting leads is removed by, for example, using a laser in the fifth step, so that the inside inner leads can be separated from the supporting leads and independent of one another without using an insulator. In addition, since the semiconductor chip and the like are already sealed with the sealing resin, there arises no problem even when the inside inner leads are separated from the outer frame of the lead frame. Accordingly, a burr-less multi-pin semiconductor device with a high packaging density can be provided without using an insulator. Furthermore, since the procedure for cutting off the outer frame is unnecessary, there is no need to remove burrs (uncut waste of the resin) formed by cutting off the outer frame. Thus, the manufacture of the semiconductor device can be simplified.

In the first step, outside inner leads whose tips are preferably separated from the ends of the inside inner leads are interposed between the inside inner leads and the outer frame; in the third step, the tips of the outside inner leads are preferably electrically connected with the electrode pads of the semiconductor chip through metal wires; and in the fourth step, at least a part of a back face of each of the outside inner leads is preferably exposed.

The method can further comprises, prior to the fourth step, a step of masking at least a back face of the connecting portion between the tips of the inside inner leads and the supporting leads with a masking member against the sealing resin, and the fifth step can be conducted after removing the masking member.

In this manner, the sealing resin can be definitely prevented from covering the back face of the connecting portion between the tips of the inside inner leads and the supporting leads.

In the first step, a projection can be formed by pressing at least on a back face of each of the inside inner leads, and prior to the fourth step, a bottom of the projection can be also masked with the masking member.

In this manner, although the pressing which can be conducted more easily and more rapidly than the half-etching is adopted, the masking member can prevent the sealing resin from covering the bottoms of the projections even when there is fluctuation in the height of the projections due to the pressing.

The third method of manufacturing a semiconductor device of this invention comprises a first step of preparing a lead frame including an outer frame, supporting leads connected with the outer frame and inside inner leads whose tips are connected with the supporting leads and whose ends are separated from the outer frame and disposed at outside of an area for a semiconductor chip; a second step of fixing the semiconductor chip on top faces of the inside inner leads of the lead frame; a third step of cutting off the inside inner leads from the supporting leads and separating the inside inner leads from one another by removing a connecting portion between the tips of the inside inner leads and the supporting leads after the second step; a fourth step of electrically connecting electrode pads of the semiconductor chip with the ends of the inside inner leads through metal wires; a fifth step of sealing, with a sealing resin, the lead frame excluding the outer frame, the semiconductor chip and the metal wires with at least a part of a back face of each of the inside inner leads exposed; and a sixth step of removing the outer frame by cutting the lead frame.

In this manner, since the connecting portion between the tips of the inside inner leads and the supporting leads is removed by, for example, using a laser in the third step, the inside inner leads can be separated from the supporting leads and independent of one another without using an insulator. In addition, the inside inner leads are already supported by the supporting leads through the semiconductor chip, there arises no problem even when the inside inner leads are separated from the outer frame of the lead frame. Accordingly, a burr-less multi-pin semiconductor device with a high packaging density can be obtained without using an insulator. Furthermore, a procedure for cutting off the outer frame is unnecessary, and there is no need to remove burrs (uncut waste of the resin) formed by cutting the outer frame. Thus, the manufacture of the semiconductor device can be simplified.

DETAILED DESCRIPTION OF THE INVENTION

Preferred embodiments of the invention will now be described with reference to the accompanying drawings.

Embodiment 1

Figure 1:
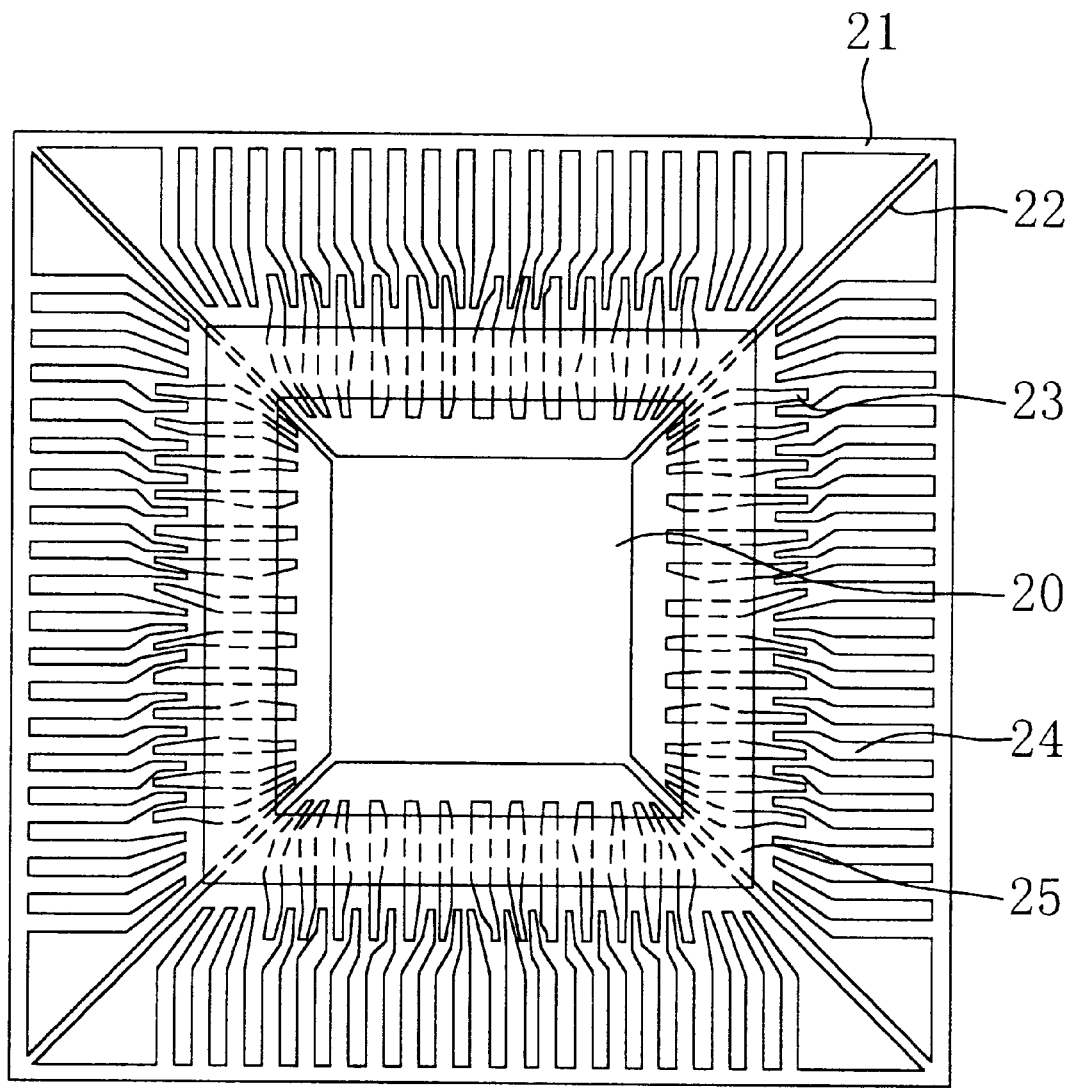
FIG. 1 is a top view of a lead frame according to a first embodiment.
Figure 2:
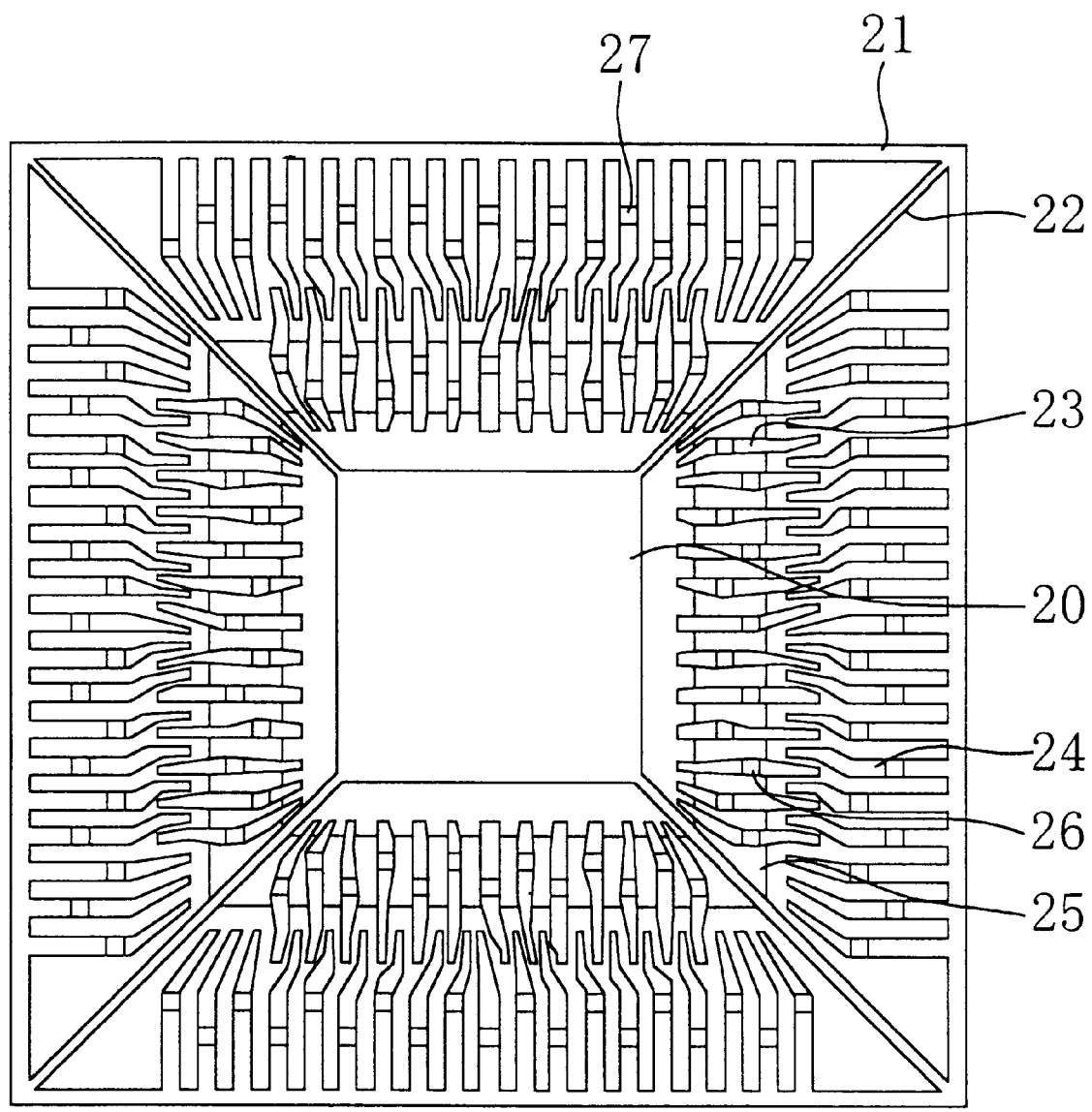
FIG. 2 is a back view of the lead frame of the first embodiment.

FIG. 1 is a top view of a lead frame according to a first embodiment, and FIG. 2 is a back view thereof.

As is shown in FIGS. 1 and 2, the lead frame of this embodiment includes a rectangular outer frame 21 for surrounding an area for the lead frame, a rectangular die pad 20 disposed at substantially the center of the area surrounded with the outer frame 21, a supporting lead 22 extending from each of the four corners of the outer frame 21 to the corresponding corner of the die pad 20, inside inner leads 23 formed with their tips disposed in the vicinity of a mounted semiconductor chip and with their ends disposed around the center between the die pad and the outer frame, outside inner leads 24 extending from the respective sides of the outer frame 21 with their chips interposed between the ends of the inside inner leads 23, and an insulator 25 such as a rectangular loop insulating tape for adhering a part of the inside inner leads 23 excluding an area in the vicinity of the ends thereof to a part of the supporting leads 22. Thus, the inside inner leads 23 are supported by the supporting leads 22 through the insulator 25. Furthermore, the respective ends of the inside inner leads 23 and the respective tips of the outside inner leads 24 are close to one another on a plane and are substantially alternately disposed.

Furthermore, as is shown in FIG. 2, projections 26 and 27 are formed on the back face of each inside inner lead 23 and the back face of each outside inner lead 24, respectively. In addition, the projections 26 of the inside inner leads 23 are disposed in a zig-zag manner as a whole, and the projections 27 of the outside inner leads 24 are also disposed in a zig-zag manner as a whole. In other words, the projections 26 and 27 of the inner leads 23 and 24 are arranged in plural lines so as to together generate plural circles. Each of the projections 26 and 27 works as a land for providing an externally projecting electrode such as a solder ball of a semiconductor device manufactured by sealing a semiconductor chip and a lead frame with a resin, and corresponds to a portion for forming an external terminal. These projections 26 and 27 can be formed through half-etching or pressing during the formation of the lead frame as described below. Alternatively, without forming the projections on the inside inner leads 23 and the outside inner leads 24, their flat back faces can be used as the external terminals.

Also, in this embodiment, the semiconductor chip is supported by a part of the inside inner leads 23 through the insulator 25, and hence, the semiconductor chip is not actually mounted on the die pad 20. In other words, the inside inner leads 23 have a function as an electrical connecting member as well as a function as a supporting member for the semiconductor chip. However, a structure for supporting the semiconductor chip by the die pad 20 can be adopted. In such a case, the supporting leads 22 are preferably set up through pressing.

The lead frame of this embodiment has the following characteristics as compared with a general lead frame:

First, as the fundamental structure, the inside inner leads 23 are not directly connected with the outer frame 21 through the outer leads as in the conventional lead frame but are supported by the supporting leads 22 through the insulator 25 in this lead frame. Furthermore, this lead frame includes neither a dam bar, which is provided to the general lead frame, nor outer leads extending outward from the dam bar.

Second, the outside inner leads 24 separated from the inside inner leads 23 are disposed at outside of the inside inner leads 23 in this lead frame, and the inner leads are thus doubly arranged for attaining a high density.

Third, the ends of the inside inner leads 23 and the tips of the outside inner leads 24 are disposed close to one another on a plane and substantially alternately disposed to be mutually interposed. However, the ends of the inside inner leads 23 and the tips of the outside inner leads 24 can be arranged so as to simply oppose one another instead of being mutually interposed.

Owing to these structural characteristics, the lead frame of this embodiment can achieve the following advantages over the conventional lead frame having the general structure:

First, since the inside inner leads 23 are supported by the supporting leads 22 through the insulator 25, there is no need to directly connect the inside inner leads 23 with the outer frame 21. Accordingly, the outside inner leads 24 separated from the inside inner leads 23 can be disposed at outside of the inside inner leads 23. In other words, the inner leads can be doubly arranged for attaining a high density. In addition, each of the inside inner leads 23 and the outside inner leads 24 is provided with a projection functioning as a connection terminal with a mother substrate, and hence, a large number of terminals can be provided. Thus, the structure of the lead frame of this embodiment can be applied to multi-pin devices.

Second, in the case where a semiconductor device is to be manufactured by mounting a semiconductor chip on this lead frame, an electrical connecting procedure (wire bonding procedure) can be rapidly and accurately carried out by extending wires such as metal wires from electrode pads of the semiconductor chip to the ends of the inside inner leads 23 and the tips of the outside inner leads 24. Specifically, since the ends of the inside inner leads 23 and the tips of the outside inner leads 24 are substantially alternately arranged to be interposed between one another, the lengths of the wires, which are determined depending upon a distance between each inside inner lead 23 and each electrode pad of the semiconductor chip and a distance between each outside inner lead 24 and each electrode pad, can be made substantially constant in the wire bonding, with avoiding the wires from coming in contact with one another. Accordingly, the wire bonding can be linearly proceeded, resulting in attaining an efficient wire bonding procedure.

In this embodiment, the inner leads are doubly disposed as the inside inner leads and the outside inner leads, but the inner leads can be triply or further multi-ply arranged. For example, a triple arrangement structure including inside inner leads, outside inner leads and intermediate inner leads can be adopted. In such a case, the intermediate inner leads and the inside inner leads excluding the outermost inner leads are required to be supported by the supporting leads through an insulating supporting tape or the like. However, the outside inner leads can also be supported by the insulating supporting tape or the like.

The insulator 25 can be made from an insulating tape such as a polyimide tape and can be made from any material that can support and be adhered to the supporting leads 22 and the inside inner leads 23 and does not exhibit a harmful effect, for example, to be peeled due to a difference in the thermal shrinkage factor from the metal for the lead frame. The insulator 25 has a thickness of, preferably, 30 through 100 $\mu$m, and more preferably, approximately 50 $\mu$m.

In FIGS. 1 and 2, the insulator 25 is shown as a continuous loop-shaped tape, but the insulator 25 is not required to have such a closed loop shape but can be partly opened as far as it can support the inside inner leads 23. Also, it is possible to support the inside inner leads 23 with the respective inside inner leads 23 and the supporting leads 22 adhered to one another with an insulating adhesive. In such a case, the resultant semiconductor device can attain a smaller thickness as a whole.

The height of each of the projections 26 and 27 is preferably approximately 30 through 150 $\mu$m and more preferably approximately 100 $\mu$m.

Also, each supporting lead 22 can connect one side of the outer frame 21 and the corresponding side of the die pad 20.

Furthermore, when the semiconductor chip is supported by the inside inner leads 23 through the insulator 25, the die pad 20 is not necessarily required to be provided, and hence, the die pad 20 can be eliminated so as to allow the area for the die pad 20 to remain as an opening. Also in such a case, it is necessary to provide the supporting leads 22 for adhering the insulator 25, and each supporting lead 22 can extend toward the opening to be terminated in the vicinity of the inside inner leads 23. Furthermore, when there is no need to mount a semiconductor chip on the die pad 20, the supporting leads 22 can extend to the center to cross each other as in a second embodiment described below. In such a case, the outer frame 21 can be advantageously reinforced to avoid twist and distortion as compared with the case where the support leads 22 are terminated around the inside inner leads.

Now, a method of manufacturing the lead frame of this embodiment will be described with reference to FIGS. 3 through 7, which are top or back views of the lead frame for showing procedures in the method of manufacturing the lead frame of this embodiment.

Figure 3:
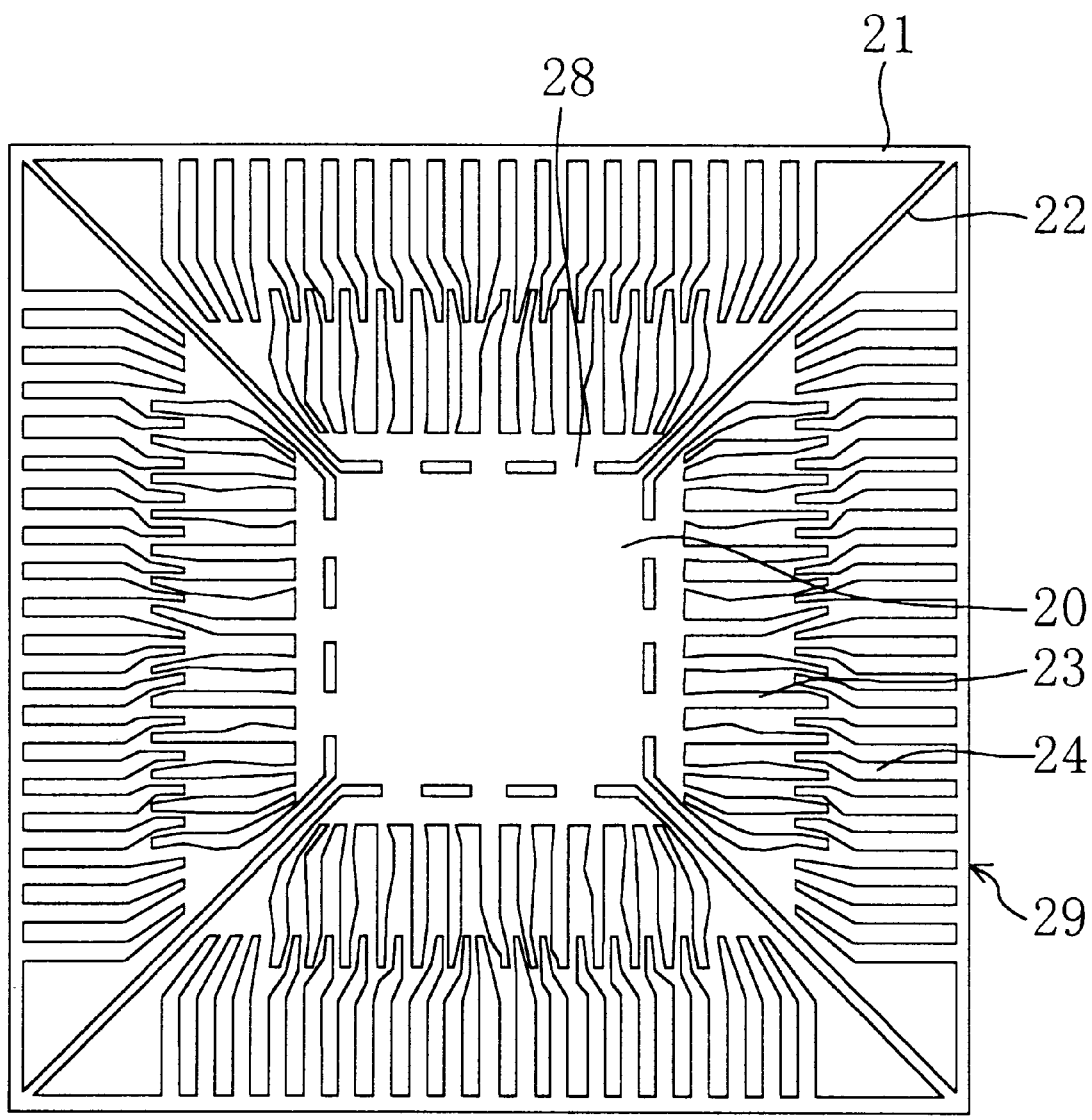
FIG. 3 is a top view of a lead frame body resulting from etching or pressing a metal plate in manufacturing procedures for the lead frame of the first embodiment.

First, as is shown in a top view of FIG. 3, a metal plate made from a copper material or the like for the lead frame is etched or pressed, thereby forming a lead frame body 29 including the rectangular outer frame 21, the rectangular die pad 20 at inside of the outer frame 21, the supporting leads 22 for connecting the corners of the outer frame 21 and the corners of the die pad 20, the inside inner leads 23 whose tips are connected with the respective sides of the die pad 20 through a connecting portion 28 and whose ends extend to the vicinity of the center between the die pad 20 and the outer frame 21, and the outside inner leads 24 separated from the inside inner leads 23 and connected with the outer frame 21. At this point, the metal plate is patterned so that the ends of the inside inner leads 23 and the tips of the outside inner leads 24 can be close to one another on a plane and substantially alternately disposed to be interposed between one another. However, the ends of the inside inner leads 23 and the tips of the outside inner leads 24 can be close to and oppose one another without being interposed between one another. In this procedure, the respective tips of the inside inner leads 23 are characteristically connected with the die pad 20 through the connecting portion 28 so that none of the inside inner leads 23 can fall off.

Figure 4:
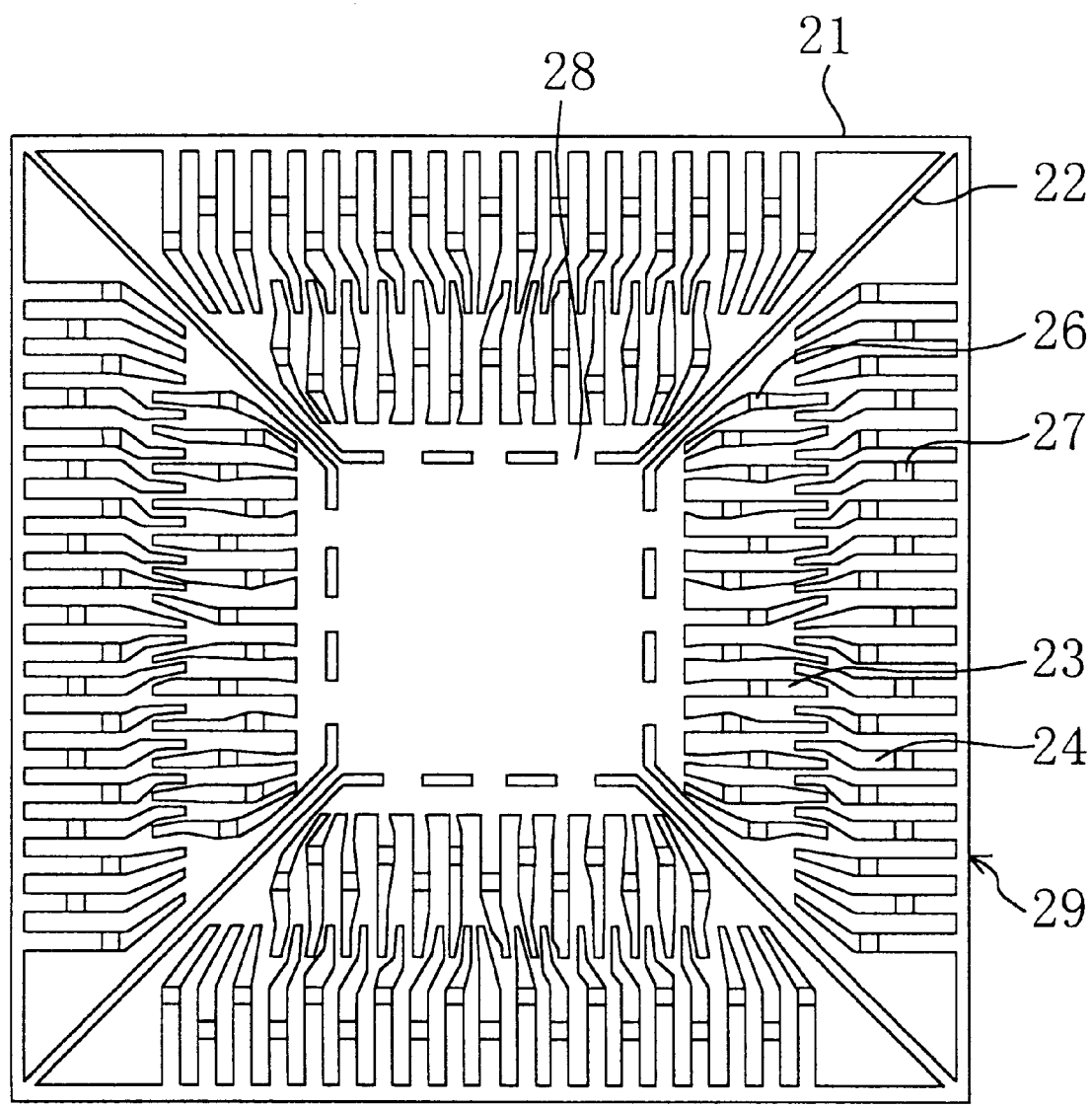
FIG. 4 is a back view of the lead frame after conducting half-etching on the back face of the lead frame body in the manufacturing procedures for the lead frame of the first embodiment.

Then, as is shown in a back view of FIG. 4, the back face of the thus obtained lead frame body 29 is half-etched, so that the lead frame body 29 can be partially removed in the direction along its thickness. Thus, the projections 26 and 27 are formed on the back faces of each inside inner lead 23 and each outside inner lead 24, respectively. These projections 26 and 27 correspond to portions not etched through the half-etching, and have a projected shape. These projections 26 and 27 work as the lands for the external terminals afterwards. It is noted that the "half-etching" herein means not only removal of an exact half of the entire thickness of a metal plate through etching but also partial etching for removing merely a part of the thickness of a metal plate. In this embodiment, the height of each of the projections 26 and 27 formed through the half-etching is approximately 100 μm. Alternatively, the projections 26 and 27 can be formed through pressing as described above.

In the case where the die pad 20 is desired to be set up, the top face of the die pad 20 can be placed at a higher level than the top faces of the inside inner leads 23 and the outside inner leads 24 by, for example, depressing the supporting leads 22.

The lead frame body 29 in a state as is shown in FIGS. 3 and 4 is generally plated with a metal such as nickel, palladium, silver and gold.

Figure 5:
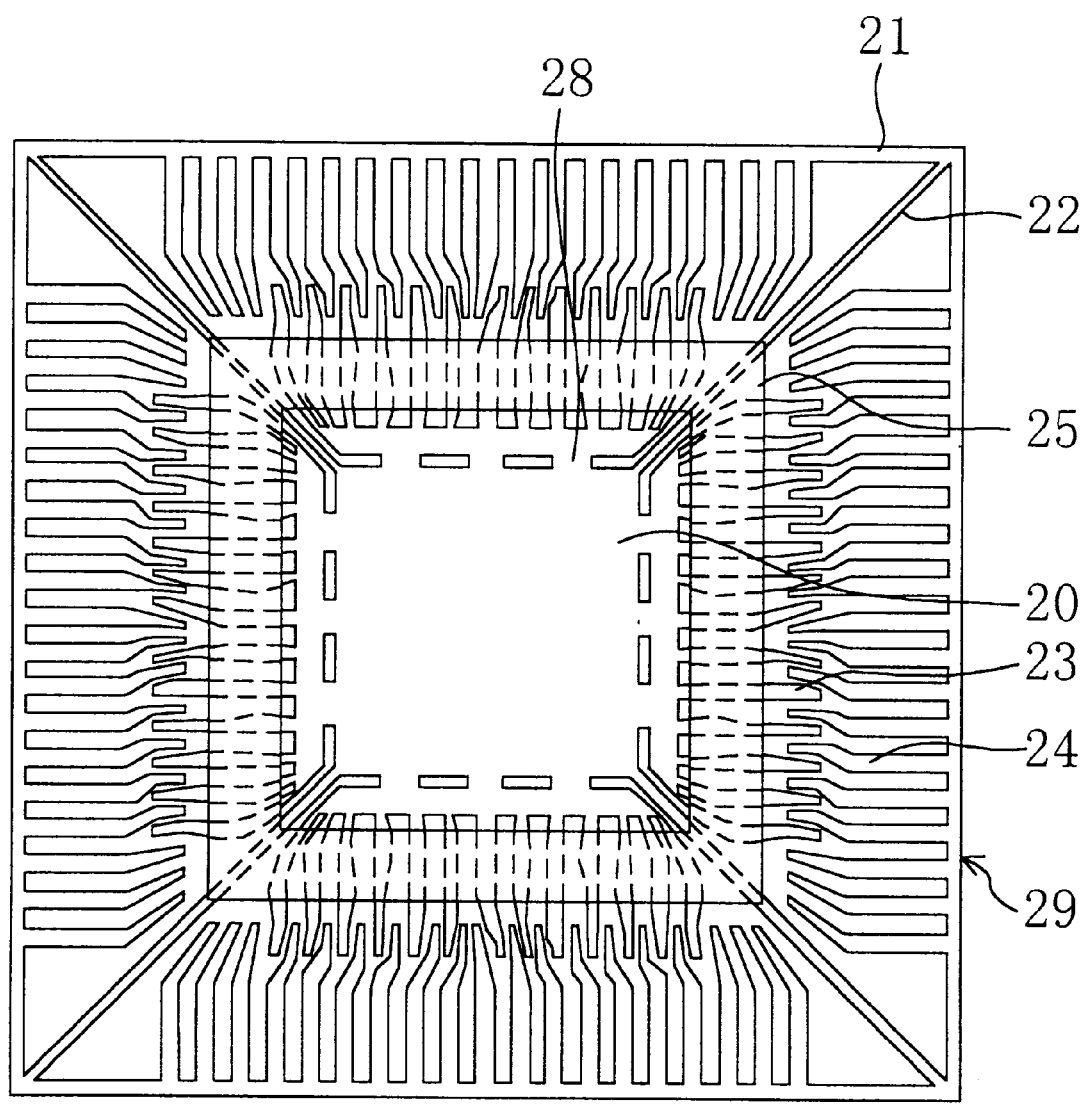
FIG. 5 is a top view of the lead frame after placing an insulator on inside inner leads and supporting leads in the manufacturing procedures for the lead frame of the first embodiment.

Next, as is shown in a top view of FIG. 5, the insulator 25 made from a rectangular loop insulating tape or the like of polyimide or the like is adhered onto the lead frame body 29, so that the insulator 25 stretches over a portion on the top faces around the tips of the inside inner leads 23 and a part of the supporting leads 22. The insulator 25 is avoided from being disposed around the ends of the inside inner leads 23. This is because the ends of the inside inner leads 23 are used for electrical connection with a semiconductor chip through metal wires afterwards and cannot be electrically conductive when they are covered with the insulator 25. In the structure shown in FIG. 5, the insulator 25 has the rectangular loop shape, but the insulator 25 can be partially adhered as far as all the inside inner leads 23 are not separated from one another and resultantly supported by the insulator 25.

Figure 6:
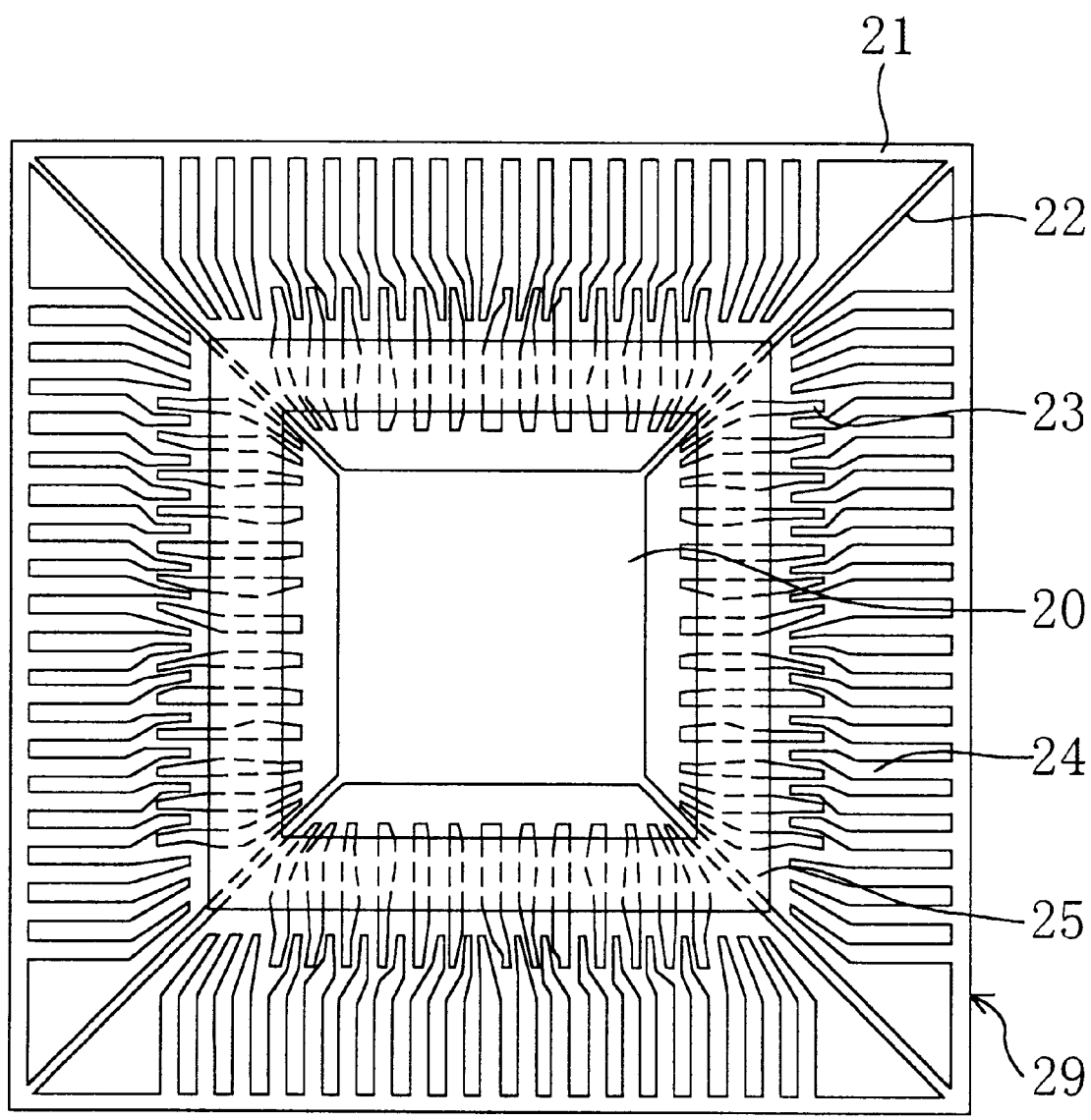
FIG. 6 is a back view of the lead frame after cutting off a connecting portion between the inside inner leads and the supporting leads in the manufacturing procedures for the lead frame of the first embodiment.
Figure 7:
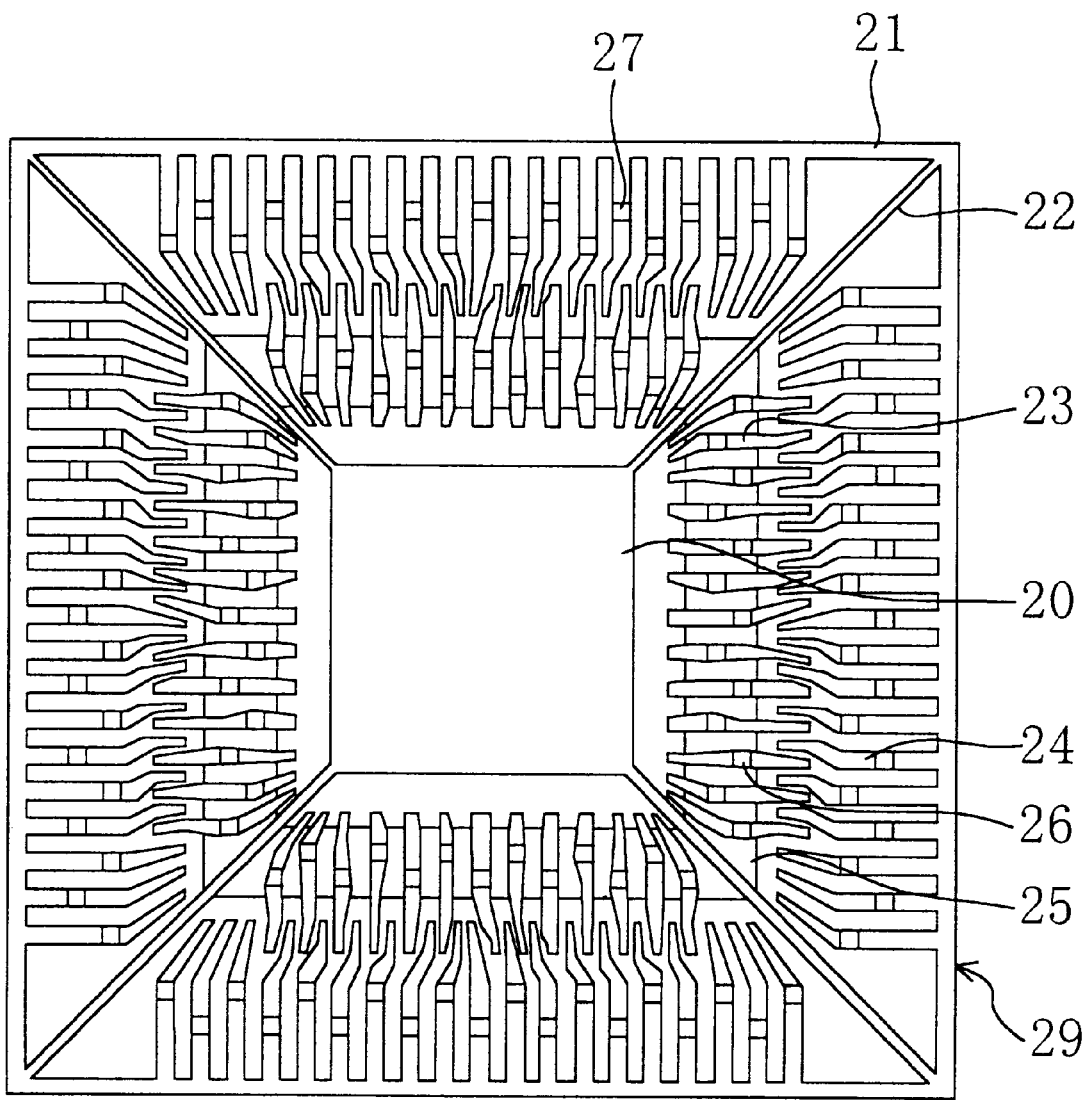
FIG. 7 is a back view of the lead frame after cutting off the connecting portion between the inside inner leads and the supporting leads in the manufacturing procedures for the lead frame of the first embodiment.

Then, as is shown in a top view of FIG. 6 and a back view of FIG. 7, a lead tip cutting procedure is conducted on the lead frame body 29, where the insulator 25 has been adhered and the inside inner leads 23 are supported by the insulator 25 connected with the supporting leads 22. In this procedure, the connecting portion 28 for connecting the tips of the inside inner leads 23 with the die pad 20 and its surrounding area are removed. Through this lead tip cutting procedure, the inside inner leads 23 can be separated from the outside inner leads 24, the outer frame 21 and the like and can be independent of one another, so as to be supported by the supporting leads 22 through the insulator 25 as is shown in FIGS. 6 and 7.

Through the aforementioned procedures, the structure of the lead frame as is shown in FIGS. 1 and 2 can be ultimately obtained.

There is no need to separate the tips of the outside inner leads 24 from the ends of the inside inner leads 23 in the initial state as is shown in FIG. 3, but they can be separated from one another, for example, after adhering the insulator 25.

Embodiment 2

Figure 8:
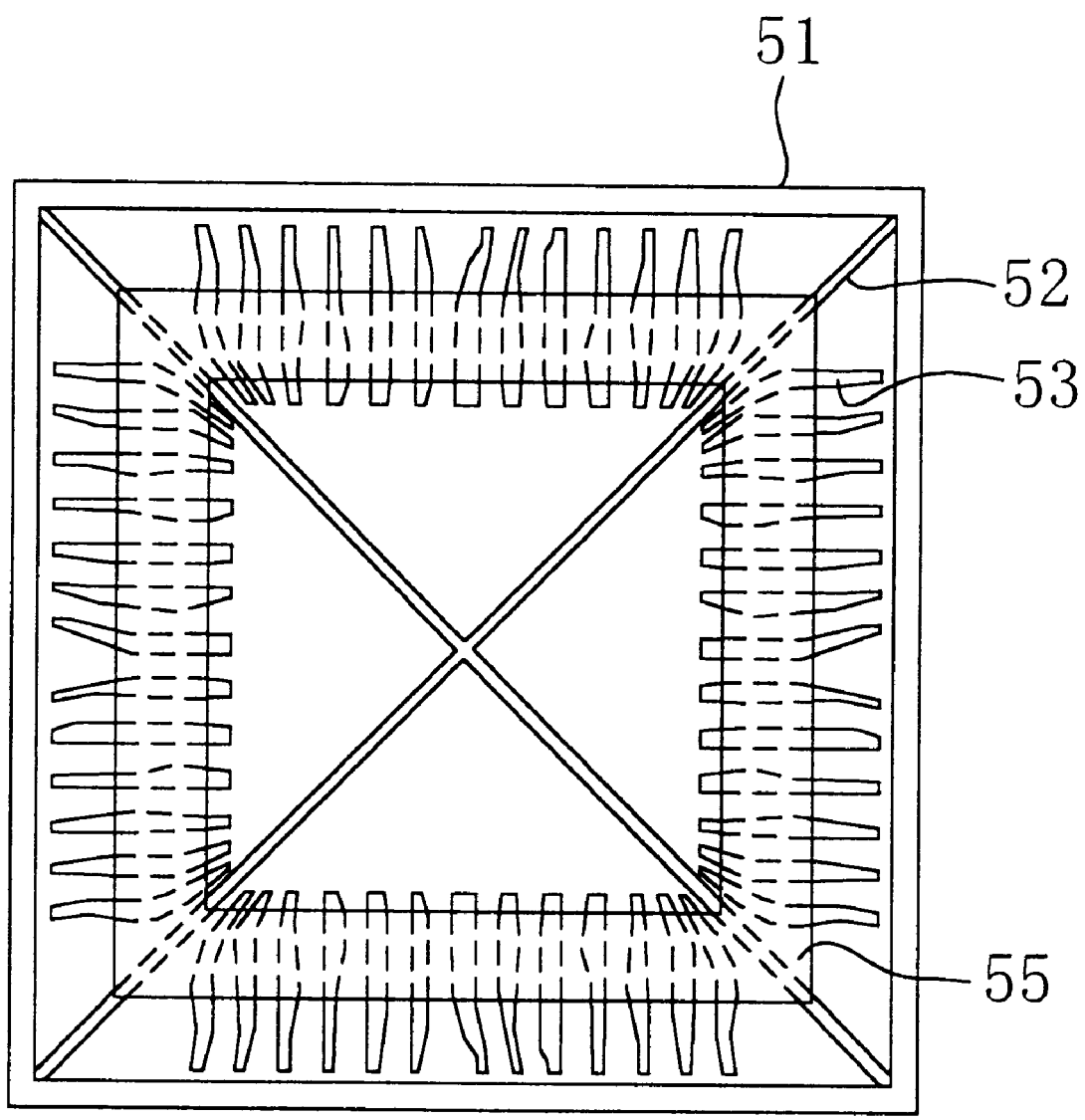
FIG. 8 is a top view of a lead frame according to a second embodiment.

A lead frame of a second embodiment, in which the outside inner leads 24 of the first embodiment are eliminated, will now be described. FIG. 8 is a top view of the lead frame of this embodiment, whereas a back view thereof is omitted.

As is shown in FIG. 8, the lead frame of this embodiment includes an outer frame 51, two supporting leads 52 for connecting the opposing corners of the outer frame 51 and crossing each other around the center, inside inner leads 53 whose tips are disposed in the vicinity of a mounted semiconductor chip and whose ends are disposed in the vicinity of the outer frame 51, and an insulator 55 such as a rectangular loop insulating tape for adhering a part of the inside inner leads 53 excluding an area in the vicinity of the ends thereof to a part of the supporting leads 52. In other words, the inside inner leads 53 are supported by the supporting leads 52 through the insulator 55 in the same manner as in the first embodiment, but differently from the first embodiment, outside inner leads are not provided and the supporting leads 52 cross each other around the center instead of providing a die pad. In this embodiment, a semiconductor chip is mounted on the insulator 55 adhered on the inside inner leads 53. Furthermore, although not shown in the drawing, the inside inner leads 53 are provided with projections on their back faces in a zig-zag manner as is shown in FIG. 2.

In the case where a semiconductor device is manufactured by using such a lead frame, since there is a constant space between the outer frame 51 and the ends of the inner leads 53 and a member corresponding to a dam bar is not included, the semiconductor device can be sealed with a resin without covering the outer frame 51 with the sealing resin. Accordingly, since the sealing resin does not cover the outer frame 51, a semiconductor device free from burrs can be obtained by separating the outer frame 51 from the package (i.e., the semiconductor device resulting from the resin sealing) at separate the connecting portion between the outer frame 51 and the supporting leads 52. In this manner, degradation in the shape accuracy due to irregularities formed on the side faces of the package can be definitely avoided. A "burr" herein means a rigid filler and the like of the resin remaining without being cut and extending outward from the package, and is an unnecessary part of the sealing resin.

Furthermore, when wires are extended between the ends of the inside inner leads 53 and the electrode pads of the semiconductor chip, the projections of the inside inner leads 53 at the inside can work as external terminals. Therefore, the resultant semiconductor device has a very small area. As a result, the lead frame of this embodiment provides a very compact semiconductor device free from burrs.

In this embodiment, when the supporting leads 52 are provided with merely a function to support the inside inner leads 53, the tips of the supporting leads 52 can be terminated in the vicinity of the tips of the inside inner leads 53. Also, it goes without saying that the lead frame can be provided with a die pad for mounting a semiconductor chip.

A method of manufacturing the lead frame of this embodiment is herein omitted because it can be presumed with ease on the basis of the manufacturing procedures described in the first embodiment.

Embodiment 3

Figure 9:
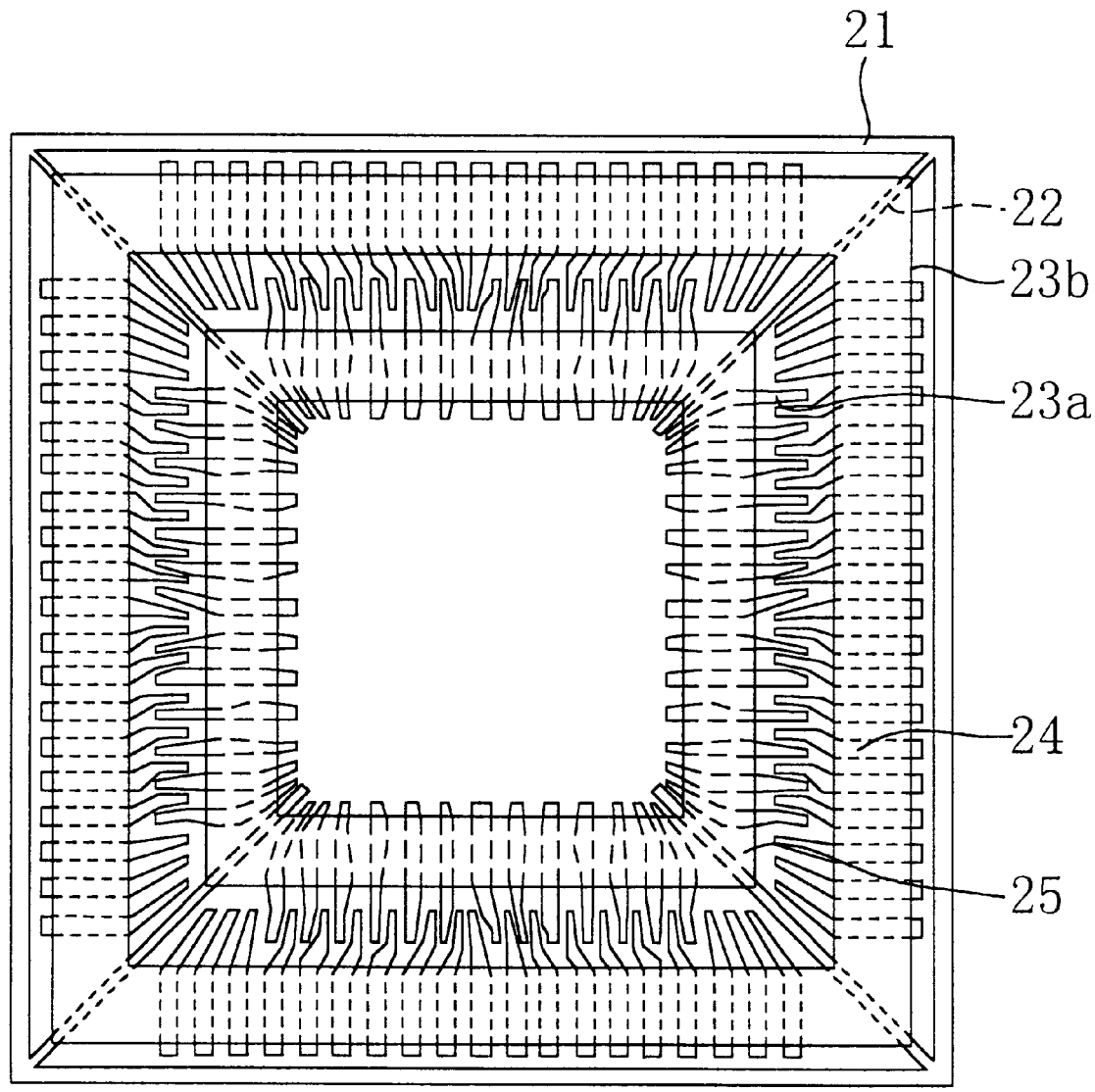
FIG. 9 is a top view of a lead frame according to a third embodiment.

A lead frame of a third embodiment, in which the outside inner leads 24 of the first embodiment are also supported by the supporting leads through the insulator, will now be described. FIG. 9 is a top view of the lead frame of this embodiment, whereas a back view thereof is omitted.

In FIG. 9, like reference numerals are used to refer to like elements used in the lead frame of the first embodiment, and the description is omitted. In this embodiment, the outside inner leads 24 are separated from the outer frame 21. The inside inner leads 23 are supported by the supporting leads 22 through a first insulator 25a, and the outside inner leads 24 are also supported by the supporting leads 22 through a second insulator 25b. Each of the supporting leads 22 extends inward from the corner of the outer frame 21 so as to have its tip in the vicinity of the tips of the inside inner leads 23. In other words, there is an opening at inside of the tips of the inside inner leads 23 and the supporting leads 22. Since the lead frame of this embodiment includes no die pad, a semiconductor chip is mounted on the first insulator 25a.

Although not shown in the drawing, both the inside inner leads 23 and the outside inner leads 24 are provided with projections on their back faces in a zig-zag manner in a plan view as is shown in FIG. 2.

When the lead frame of this embodiment is used, there is no need to connect the ends of the outside inner leads 24 with the outer frame 21, and hence, the resultant semiconductor device is free from burrs as that of the second embodiment. Specifically, the lead frame of this embodiment is advantageously applicable to multi-pin devices and provides a semiconductor device free from burrs.

Also in this embodiment, the lead frame can be provided with a die pad as in the first embodiment or crossing supporting leads as in the second embodiment.

A method of manufacturing the lead frame of this embodiment can be presumed with ease on the basis of the manufacturing procedures described in the first embodiment. However, as characteristics of the manufacturing method of this embodiment, the ends of the outside inner leads are separated from the outer frame 21 from, for example, the state shown in FIG. 3, and the die pad 20 is removed from the supporting leads 22. There is no need to separate the tips of the outside inner leads 24 from the ends of the inside inner leads 23 in the initial state as is shown in FIG. 3, but they can be separated from one another, for example, after adhering the second insulator 25b. In this case, the ends of the outside inner leads 24 are not required to be connected with the outer frame 21 in the initial state as is shown in FIG. 3.

Embodiment 4

Figure 10:
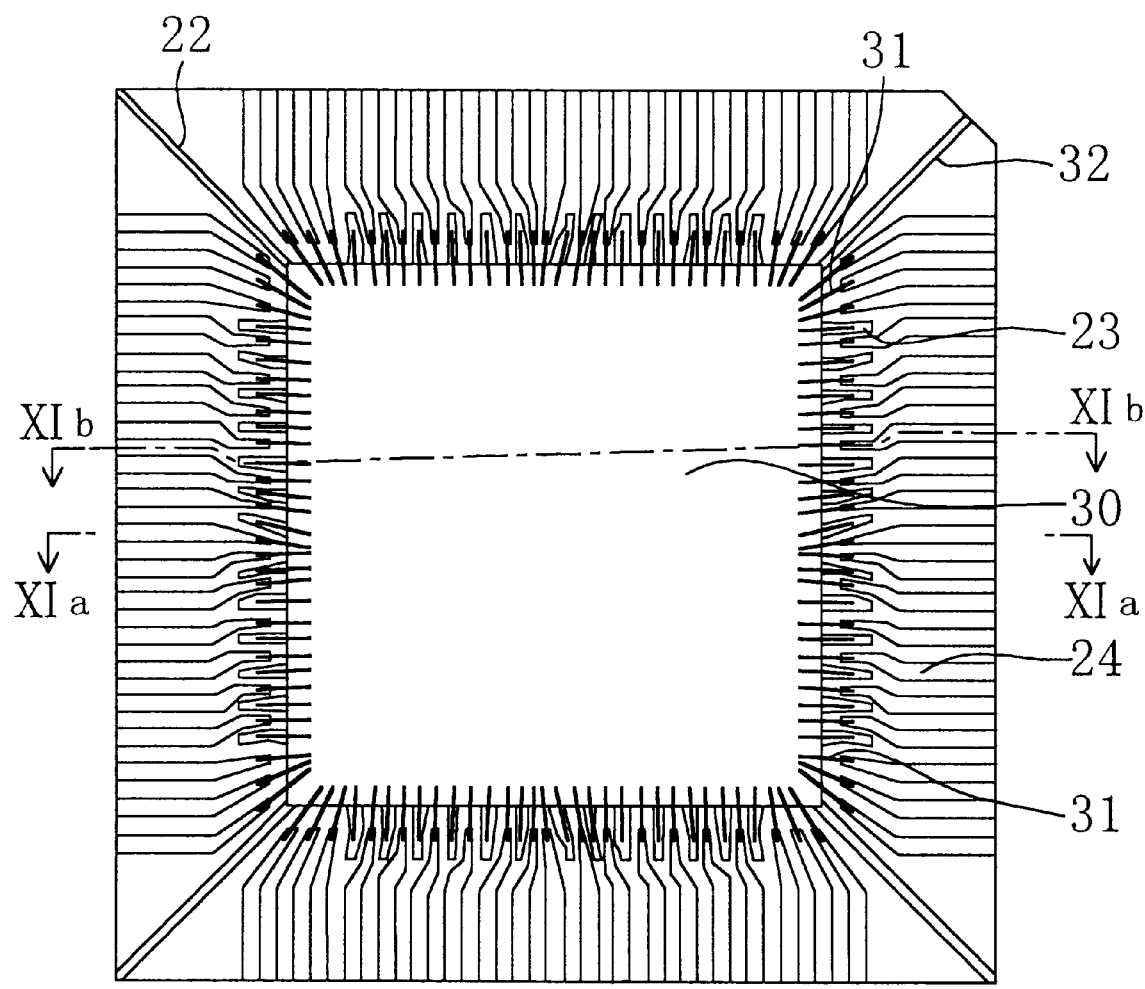
FIG. 10 is a plan view of a semiconductor device according to a fourth embodiment, with a sealing resin transparentized for showing the inside thereof.

A semiconductor device according to a fourth embodiment using the lead frame of the first embodiment will now be described. FIG. 10 is a plan view of the semiconductor device of this embodiment, wherein a sealing resin is transparentized and merely the outline thereof is shown so as to reveal the inside. Also, FIGS. 11(a) and 11(b) are sectional views taken on lines XIa—XIa and XIb—XIb of FIG. 10, respectively, FIG. 12 is a plan view of the semiconductor device with the sealing resin not transparentized, and FIG. 13 is a bottom view of the semiconductor device.

As is shown in FIGS. 10 through 13, the semiconductor device of this embodiment utilizes the lead frame described in the first embodiment and shown in FIGS. 1 and 2 with the outer frame 21 cut off. Specifically, the lead frame used in this embodiment includes the rectangular die pad 20, the supporting leads 22 connected with the four corners of the die pad 20, the inside inner leads 23 whose tips are disposed in the vicinity of a semiconductor chip 30 and whose ends are disposed in the vicinity of the center between the die pad and the outer frame, the outside inner leads 24 whose tips are interposed between the ends of the inside inner leads 23, and the insulator 25 such as a rectangular loop insulating tape for adhering a part of the inside inner leads 23 excluding an area in the vicinity of the ends thereof to a part of the supporting leads 22. On the insulator 25, the semiconductor chip 30 is mounted, and electrode pads of the semiconductor chip 30 are electrically connected with the ends of the inside inner leads 23 and with the tips of the outside inner leads 24 through metal wires 31. The die pad 20, the semiconductor chip 30, the supporting leads 22, the inside inner leads 23, the outside inner leads 24 and the metal wires 31 are sealed with a sealing resin 32, thereby totally forming one package.

Figure 13:
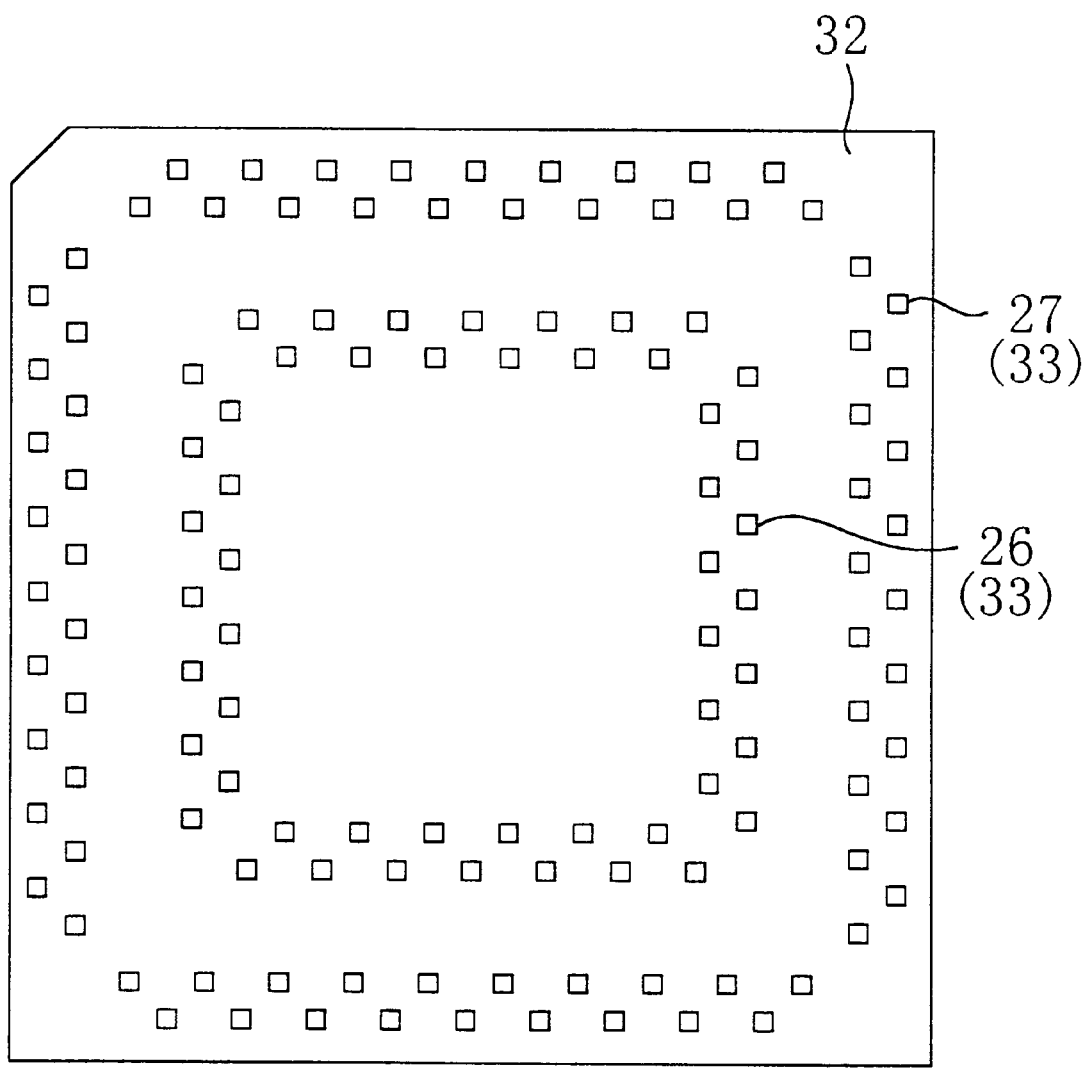
FIG. 13 is a bottom view of the semiconductor device of the fourth embodiment.

Also, as is shown in the bottom view of FIG. 13, bottoms of plural projections 26 and 27, which are formed on the back faces of the inside inner leads 23 and the outside inner leads 24, respectively, are uncovered with the sealing resin 32, and the uncovered bottoms of the projections 26 and 27 actually work as external terminals 33 arranged in the shape of grid. In other words, the sealing resin 32 is formed on the back surface not mounting the semiconductor chip 30, so that the bottoms of the plural projections 26 and 27 formed on the back faces of the inside inner leads 23 and the outside inner leads 24 cannot be covered but merely the projected portions of the projections 26 and 27, namely, the height of each projection, can be covered with the sealing resin 32. As a result, a power for holding the inner leads 23 and 24 by the sealing resin can be enforced. On the top surface mounting the semiconductor chip 30, the sealing resin 32 is formed so as to cover the semiconductor chip 30 and the metal wires 31 for attaining a thickness as small as possible.

Figure 11A:
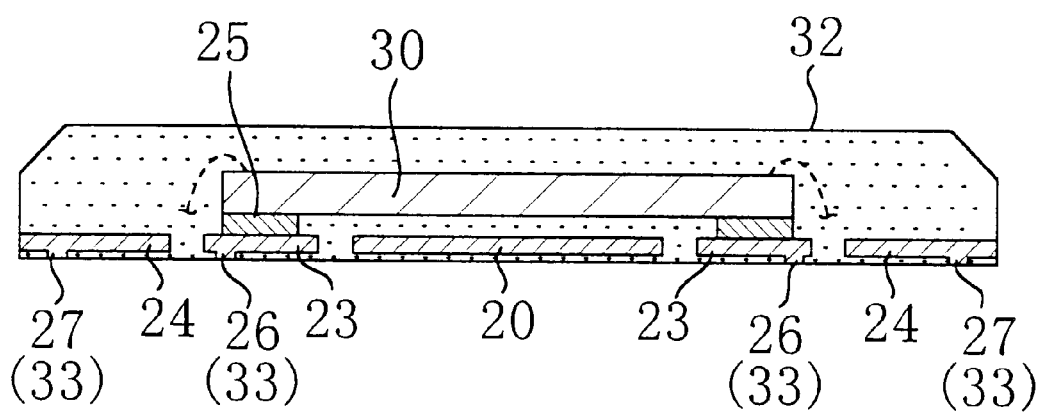
FIGS. 11(a) and 11(b) are sectional views taken on lines XIa—XIa and XIb—XIb of FIG. 10, respectively.
Figure 11B:
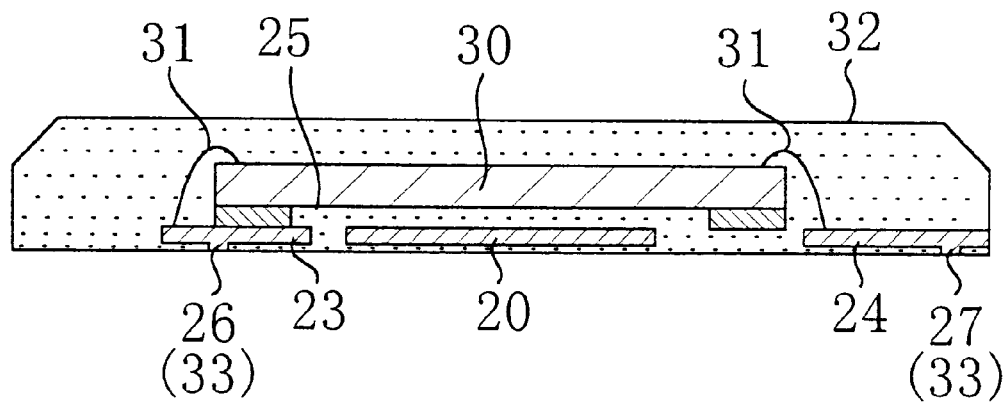
Figure 12:
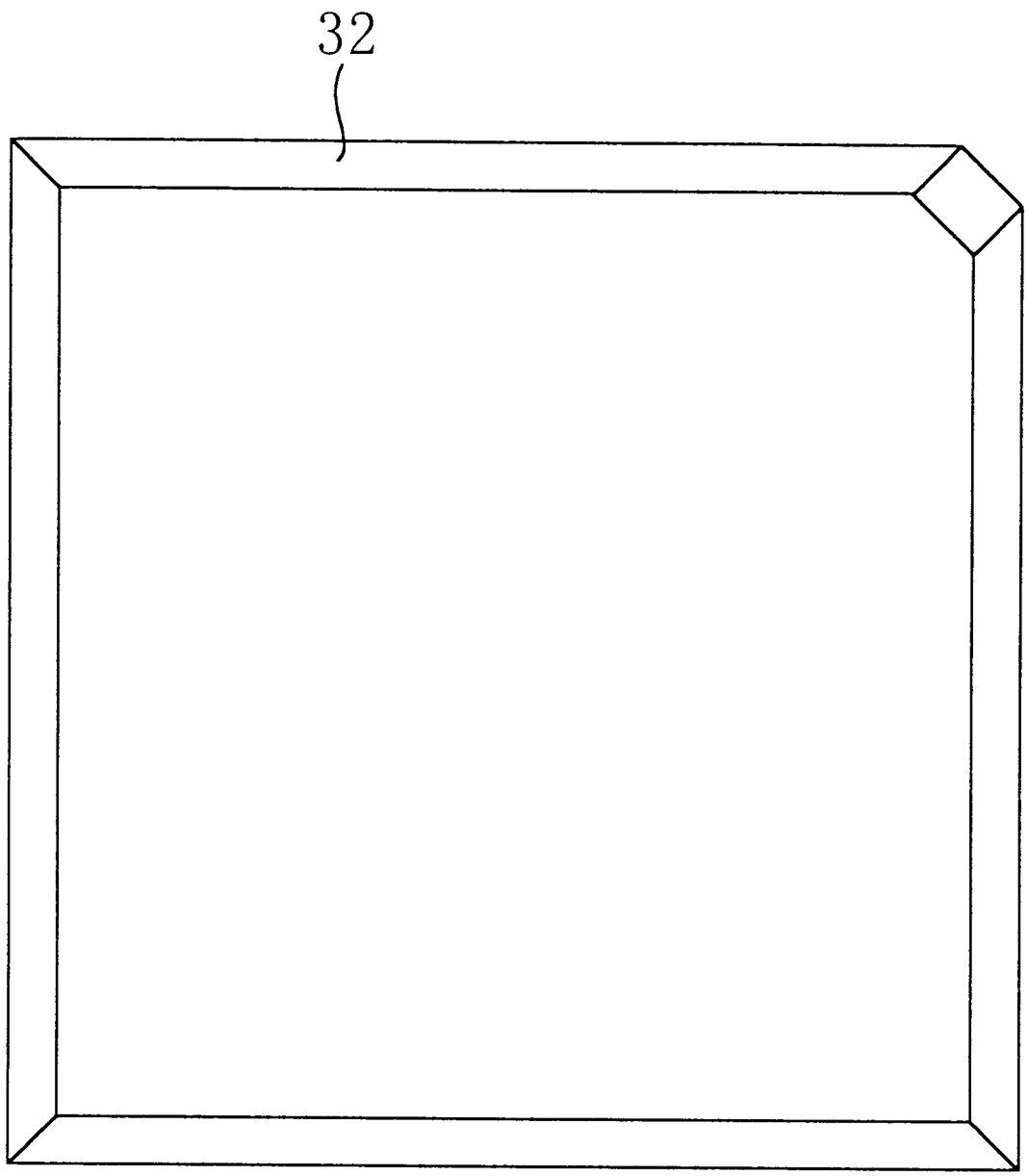
FIG. 12 is a plan view of the semiconductor device of the fourth embodiment with the sealing resin not transparentized.
Figure 14:
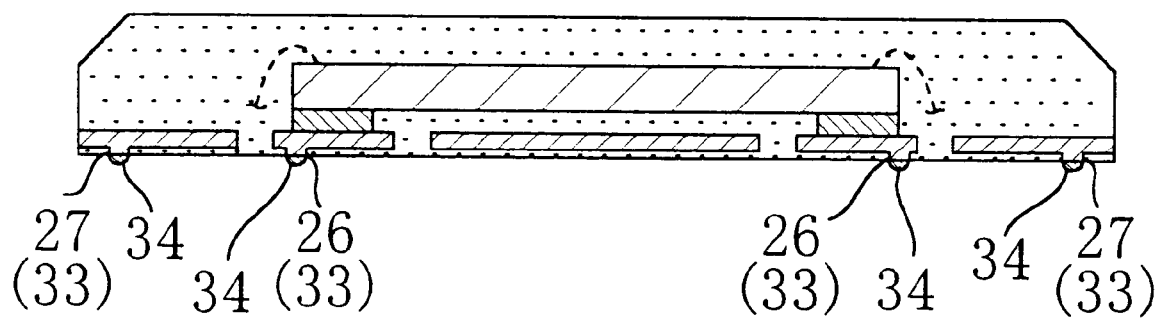
FIG. 14 is a sectional view of the semiconductor device of the fourth embodiment provided with ball electrodes on projections, taken on line XIa—XIa of FIG. 10.

FIG. 14 is a sectional view of the semiconductor device taken on the same section as that in FIG. 11(a), wherein the external terminals 33, that is, the projections 26 and 27, on the back faces of the inner leads 23 and 24 are provided with solder balls 34. In this manner, the solder balls 34 can be stably plane-mounted on a packaging substrate as the external electrodes.

Figure 30:
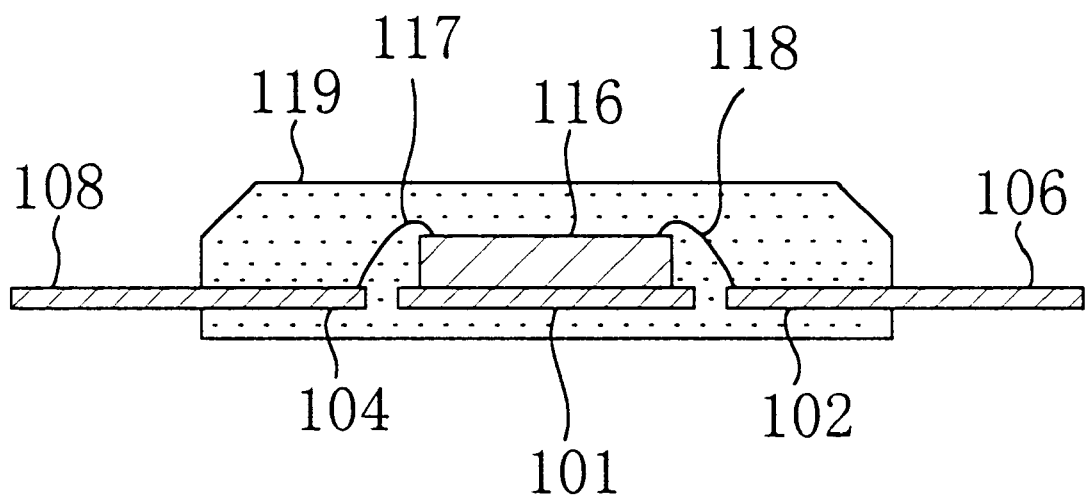
FIG. 30 is a sectional view taken on line XXX—XXX of FIG. 29.

In the semiconductor device of this embodiment, the ends of the inside inner leads 23 and the tips of the outside inner leads 24 are interposed between one another, close to one another on a plane, and disposed substantially alternately. Thus, the inside inner leads 23 and the outside inner leads 24 are doubly arranged. Therefore, the inner leads can be disposed at a high density without decreasing the pitch between the inner leads as in the conventional single arrangement. As a result, when the semiconductor chip 30 is mounted on the insulator 25 in the vicinity of the tips of the inside inner leads 23 and the electrode pads on the semiconductor chip 30 are electrically connected with the inside inner leads 23 and the outside inner leads 24 through connecting means such as the metal wires 31, the projections 26 and 27 on the back faces of the inside inner leads 23 and the outside inner leads 24 work as the external terminals 33. Therefore, differently from the conventional semiconductor device provided with external terminals on its side faces, the external terminals of this embodiment can be provided on the bottom in the shape of a grid. In other words, differently from the conventional semiconductor device of FIG. 30 in which the external terminals (outer leads 106) are linearly arranged along the side faces of the package, the external terminals can be disposed on a plane. Therefore, a small package can be provided with a large number of external terminals, resulting in attaining a high packaging density. Thus, in the semiconductor device of this embodiment, the external terminals are disposed on the bottom of the semiconductor device in the shape of a grid, and hence, the semiconductor device can attain a higher packaging density as compared with the conventional semiconductor device.

It goes without saying that the lead frame of the first embodiment can be replaced with the lead frame of the second or third embodiment.

In such a case, the lead frame of the second embodiment provides a very compact semiconductor device free from burrs.

The lead frame of the third embodiment provides a semiconductor device with a high packaging density free from burrs.

In FIGS. 11(a) and 11(b), the semiconductor chip 30 is supported by the inside inner leads 23 through the insulator 25. Specifically, the die pad 20 is placed on the same plane as the inner leads 23 and 24 and does not hold the semiconductor chip 30. However, the semiconductor chip 30 can be directly bonded onto the die pad 20 by depressing the supporting leads 22 so as to set up the top face of the die pad 20 against the top faces of the inner leads 23 and 24. In particular, when the semiconductor chip is so small that it cannot be bonded onto the insulator 25 fixed on the inside inner leads 23, the semiconductor chip is required to be bonded onto the die pad 20.

Furthermore, in FIG. 13, the back faces of the supporting leads 22 and the die pad 20 are also half-etched, and hence, the back faces of the supporting leads 22 and the die pad 20 do not appear on the bottom of the semiconductor device. However, without conducting the half-etching on the back faces of the supporting leads 22 and the die pad 20, the back faces thereof can be exposed on the bottom of the semiconductor device. Also in such a case, when the top face of the die pad 20 is set up against the top faces of the inside inner leads 23 and the outside inner leads 24 by depressing the supporting leads 22 so as to support the semiconductor chip 30 by the die pad 20, a part of the back faces of the supporting leads 22 at outside of the depressed portions is exposed on the bottom of the semiconductor device.

Next, a method of manufacturing the semiconductor device of this embodiment will be described with reference to FIGS. 15 through 18, which are plan views for showing manufacturing procedures for the semiconductor device, wherein the sealing resin is transparentized and the outline thereof alone is shown so as to reveal the inside.

Figure 15:
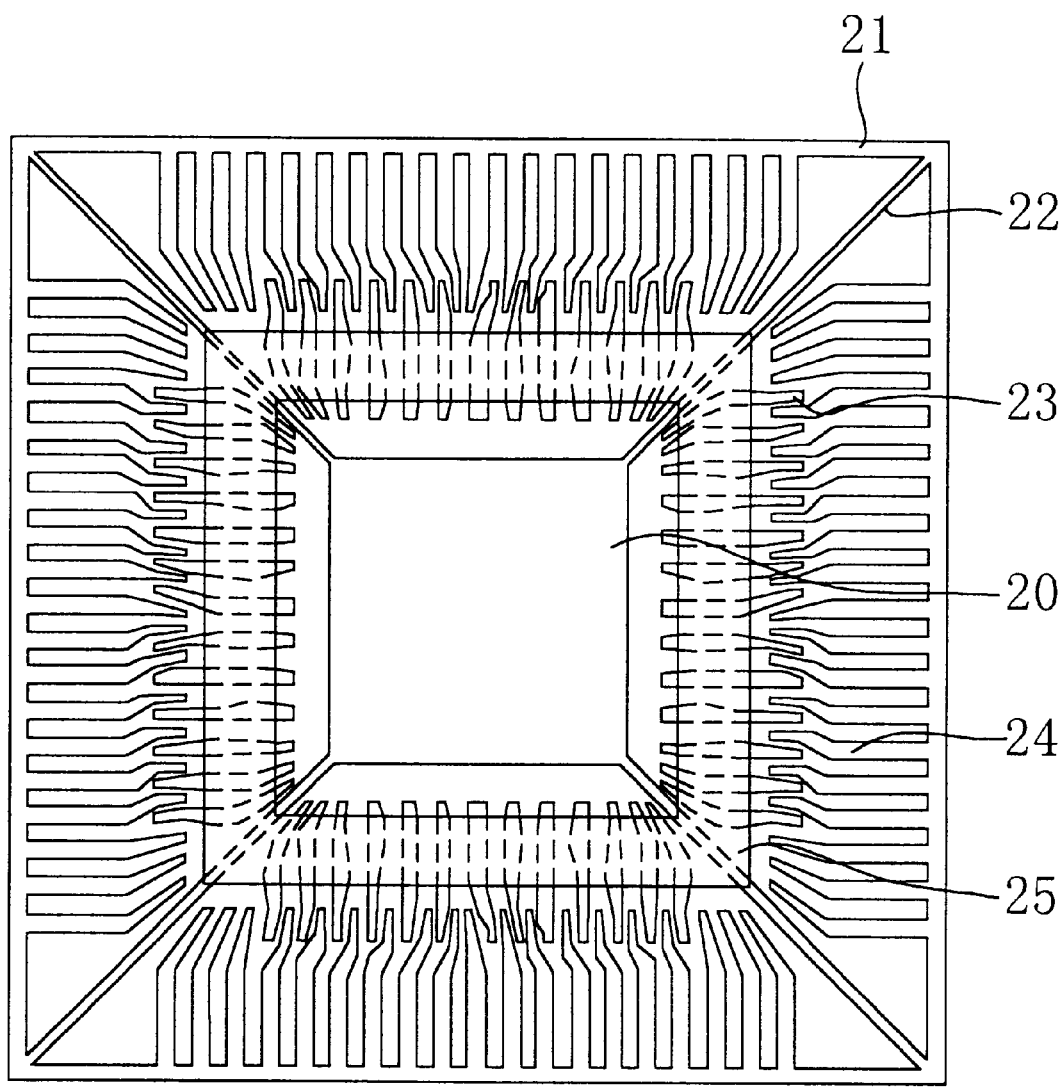
FIG. 15 is a plan view of a lead frame prepared in a preparing procedure in manufacturing procedures for the semiconductor device of the fourth embodiment.

First, as is shown in FIG. 15, the lead frame including the following members is prepared: The rectangular outer frame 21 surrounding an area for forming the lead frame; the rectangular die pad 20 disposed at substantially the center of the area surrounded with the outer frame 21; the supporting leads 22 extending from the four corners of the outer frame 21 to be connected with the four corners of the die pad 20; the inside inner leads 23 whose tips are disposed in the vicinity of a mounted semiconductor chip and whose ends are disposed in the vicinity of the center between the die pad and the outer frame; the outside inner leads 24 extending from the respective sides of the outer frame 21 so as to have their tips interposed between the ends of the inside inner leads 23; and the insulator 25 such as a rectangular loop insulating tape for adhering a part of the inside inner leads 23 excluding an area in the vicinity of the ends thereof to a part of the supporting leads 22. Although not shown, the inside inner leads 23 and the outside inner leads 24 are provided with the projections working as the lands as described in the first embodiment. Also, the ends of the inside inner leads 23 and the tips of the outside inner leads 24 are interposed between one another, close to one another on a plane and disposed substantially alternately.

Figure 16:
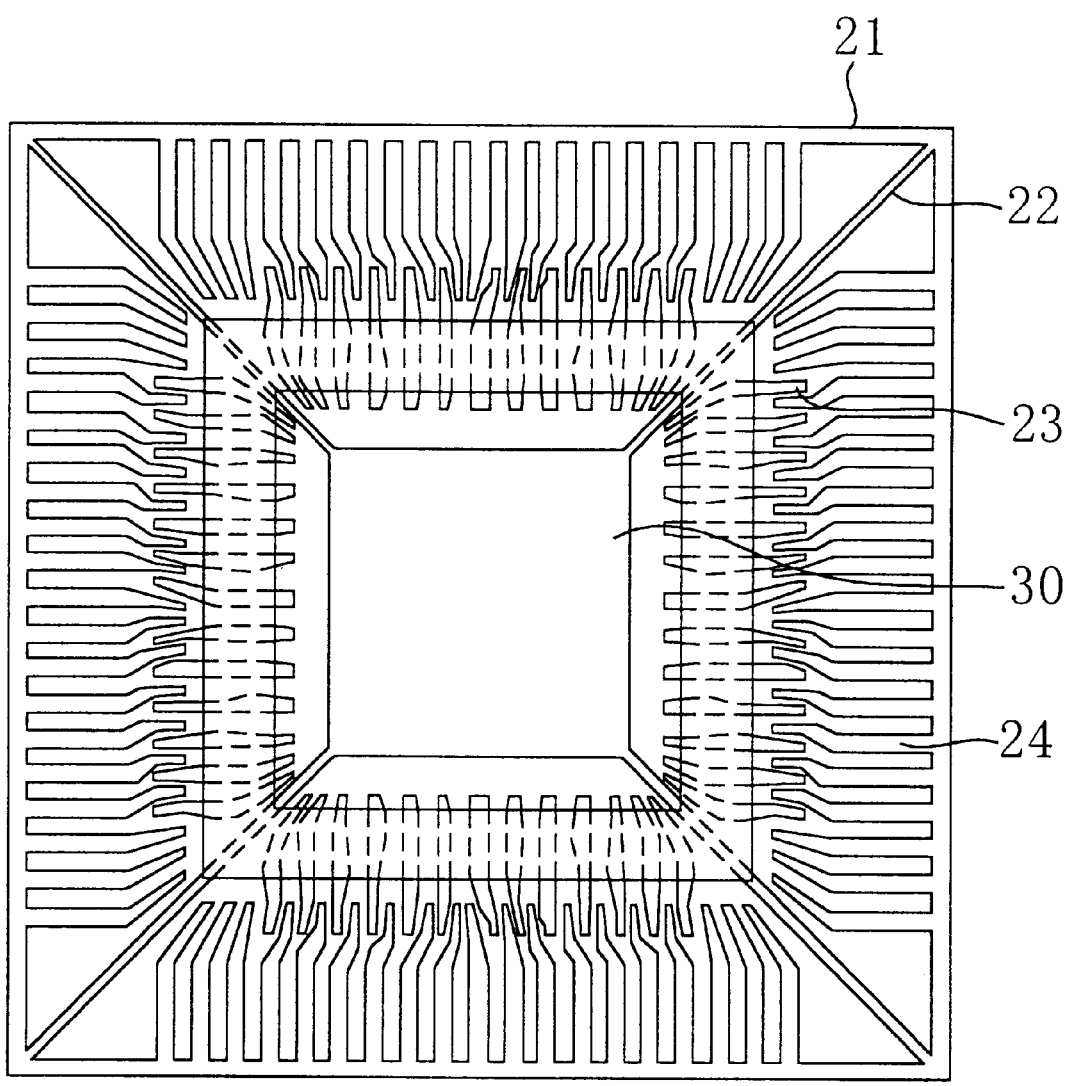
FIG. 16 is a plan view for showing a semiconductor chip mounted on the lead frame in the manufacturing procedures for the semiconductor device of the fourth embodiment.

Next, as is shown in FIG. 16, in the prepared lead frame, the semiconductor chip 30 is mounted and fixed onto the insulator 25 adhered to a part of the inside inner leads 23. The semiconductor chip 30 can be fixed by using, for example, an insulating heat resistant adhesive.

In the case where the die pad 20 is set up in the used lead frame, the semiconductor chip 30 can be bonded onto the die pad 20 by using a sealant. Furthermore, in the case where the semiconductor chip 30 is supported by the inside inner leads 23 through the insulator 25 as in this embodiment, the die pad 20 can be removed from the used lead frame and an opening can remain at inside of the tips of the inside inner leads 23 and the supporting leads 22 as is shown in FIG. 9.

Figure 17:
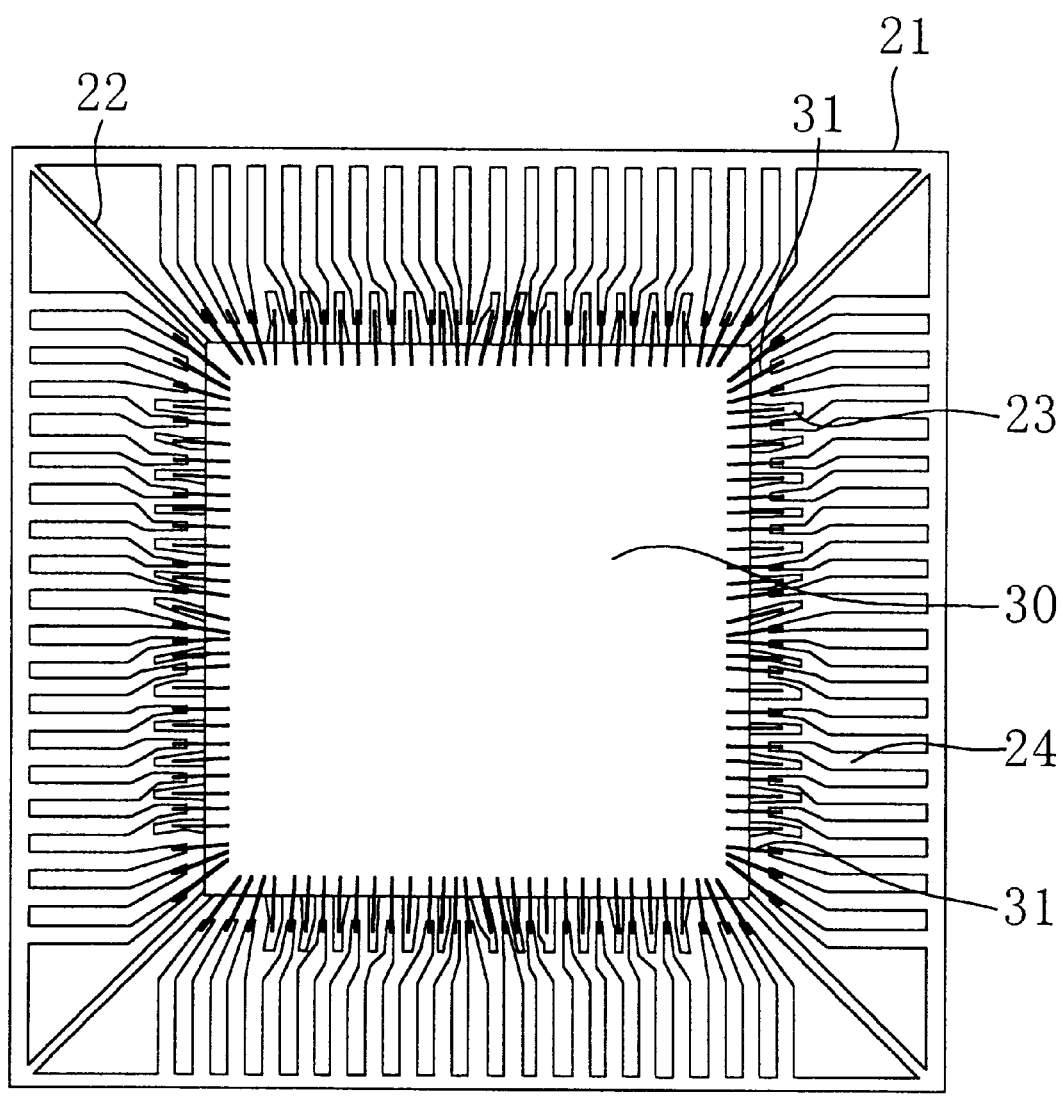
FIG. 17 is a plan view for showing wire bonding between electrode pads of the semiconductor chip and inside and outside inner leads in the manufacturing procedures for the semiconductor device of the fourth embodiment.

Then, as is shown in FIG. 17, the electrode pads of the semiconductor chip 30 are electrically connected with the ends of the inside inner leads 23 of the lead frame by using the metal wires 31. Similarly, the electrode pads of the semiconductor chip 30 are electrically connected with the tips of the outside inner leads 24 of the lead frame by using the metal wires 31. At this point, since the ends of the inside inner leads 23 and the tips of the outside inner leads 24 are interposed between one another and disposed substantially alternately, the lengths of the wires, which can be determined depending upon a distance from each inside inner lead 23 to each electrode pad of the semiconductor chip and a distance from each outside inner lead 24 to each electrode pad, can be made substantially constant. Accordingly, the wire bonding can be linearly proceeded, resulting in efficient wire bonding.

Figure 18:
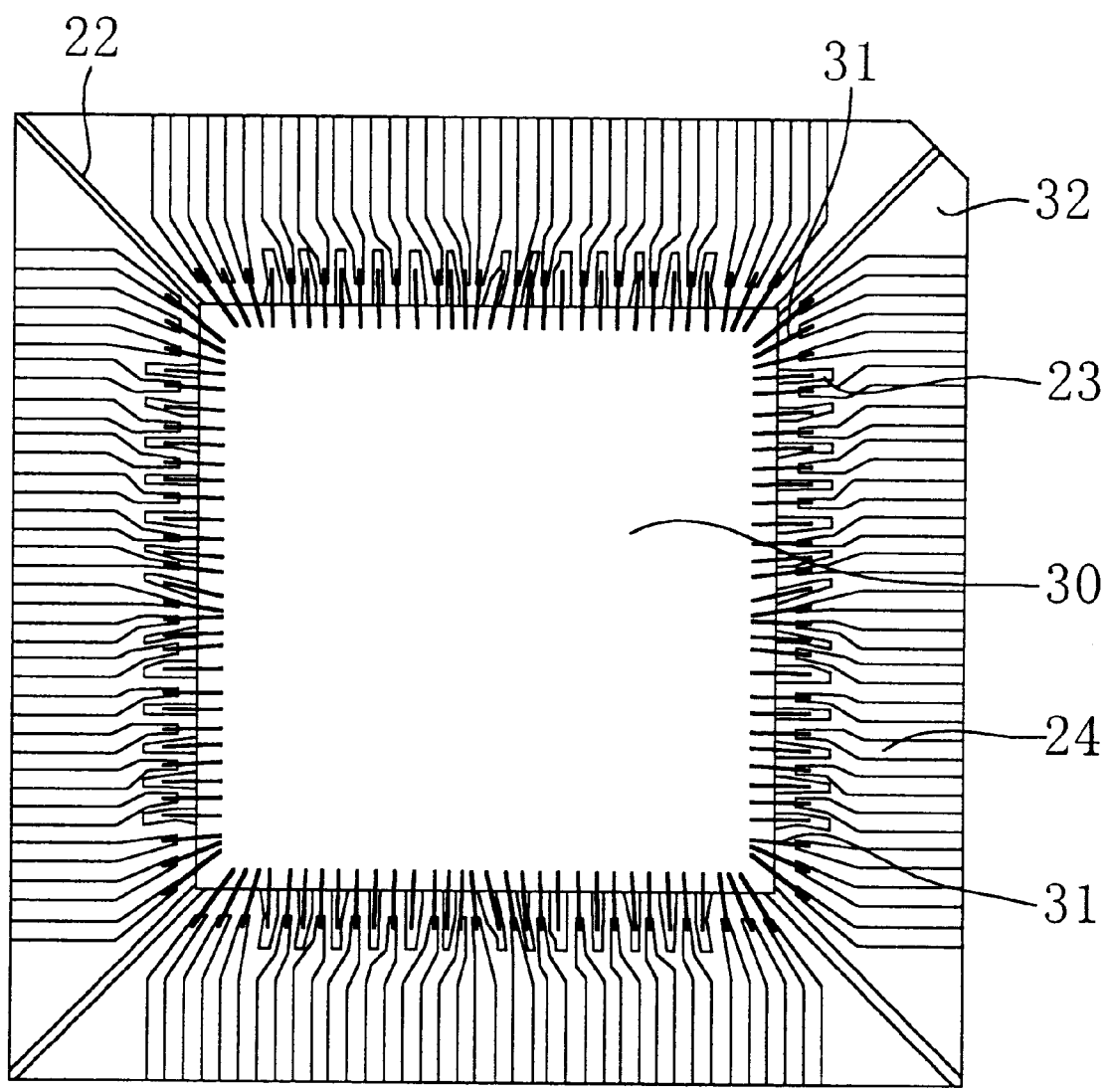
FIG. 18 is a plan view for showing a procedure for cutting off an outer frame after resin sealing in the manufacturing procedures for the semiconductor device of the fourth embodiment, with a sealing resin shown as a transparent substance.

Next, as is shown in FIG. 18, the die pad 20, the supporting leads 22, the inside inner leads 23, the outside inner leads 24, the insulator 25, the semiconductor chip 30 and the metal wires 31 are sealed with the sealing resin 32. Thus, the semiconductor device can be completed.

In the manufacturing procedures of this embodiment, the lead frame of the first embodiment is used and the used lead frame does not include a dam bar, and therefore, a procedure for cutting off a dam bar as in the conventional procedures is not necessary.

Embodiment 5

In a fifth embodiment, a semiconductor device having a similar structure to that of the fourth embodiment but using no insulator will be described. FIGS. 19 through 25 are plan or sectional views for showing manufacturing procedures for the semiconductor device of this embodiment.

Figure 19:
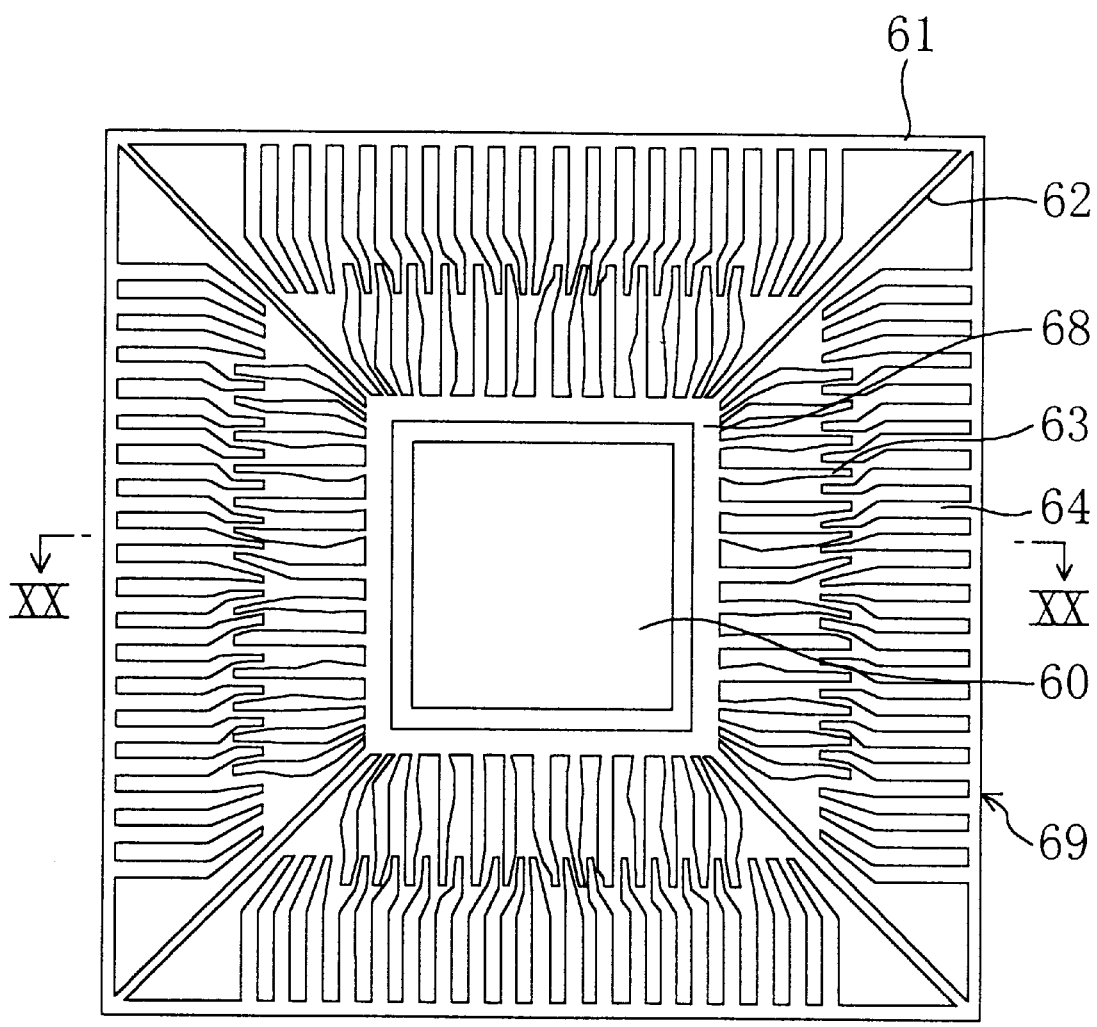
FIG. 19 is a plan view of a lead frame prepared in a preparing procedure in manufacturing procedures for a semiconductor device of a fifth embodiment.

First, as is shown in FIG. 19, a lead frame including the following members is prepared: A rectangular outer frame 61 surrounding an area for forming the lead frame; a rectangular die pad 60 disposed at substantially the center of the area surrounded with the outer frame 61; supporting leads 62 extending from the four corners of the outer frame 61 to be connected with the four corners of the die pad 60; inside inner leads 63 whose tips are disposed in the vicinity of a mounted semiconductor chip and whose ends are disposed around the center between the die pad and the outer frame; and outside inner leads 64 extending from the respective sides of the outer frame 61 so as to have their tips interposed between the ends of the inside inner leads 63. At this point, the ends of the inside inner leads 63 and the tips of the outside inner leads 64 are close to one another on a plane and are disposed substantially alternately. In this embodiment, the die pad 60 is depressed, so as to be set up against the inner leads 63 and 64. Furthermore, an area at outside of the depressed portion works as a connecting portion 68 for connecting the inside inner leads 63 and the supporting leads 62.

Figure 20:
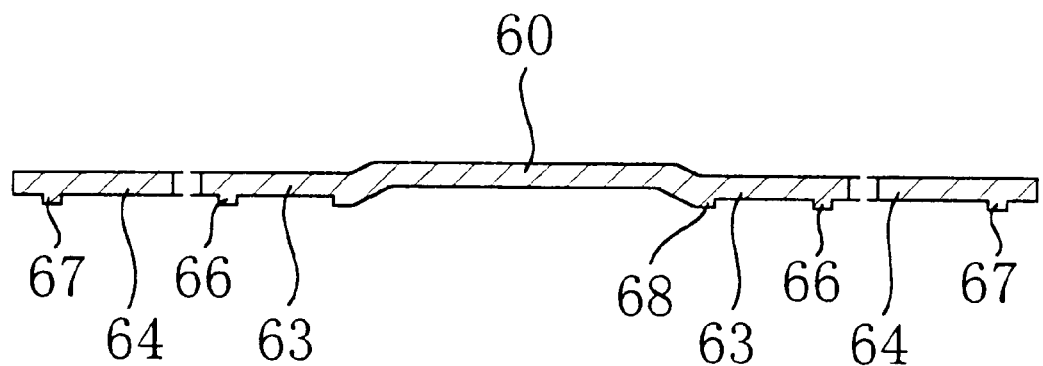
FIG. 20 is a sectional view taken on line XX—XX of FIG. 19.

FIG. 20 is a sectional view taken on line XX—XX of FIG. 19. As is shown in FIG. 20, the inside inner leads 63 and the outside inner leads 64 are provided, on their back faces, with plurality of projections 66 and 67 working as lands and formed through the half-etching. At this point, a part at inside of the connecting portion 68 disposed at outside of the depressed portion is not half-etched, so that the bottom of the connecting portion 68 can be placed at the same level as the bottoms of the projections 66 and 67.

Figure 21:
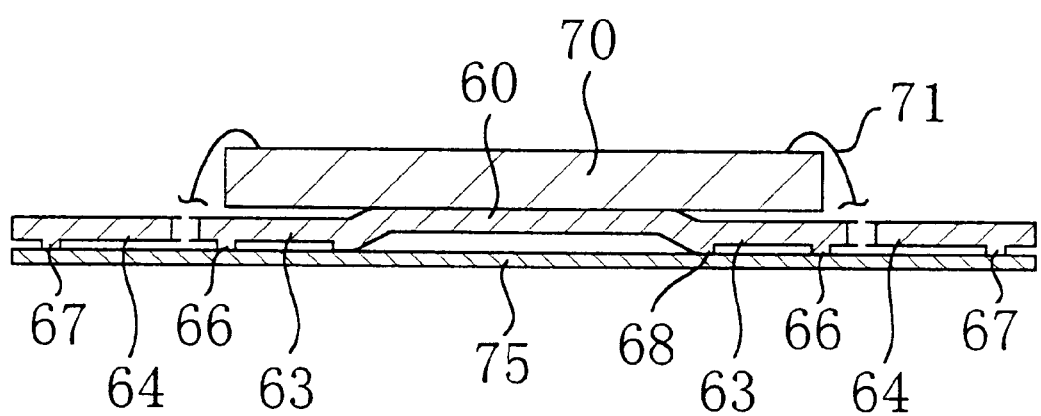
FIG. 21 is a sectional view for showing a semiconductor chip mounted on the lead frame in the manufacturing procedures for the semiconductor device of the fifth embodiment, taken on line XX—XX of FIG. 19.

Next, as is shown in FIG. 21, a semiconductor chip 70 is mounted on the die pad 60 of the lead frame. Then, electrode pads of the semiconductor chip 70 are electrically connected with the inside inner leads 63 and the outside inner leads 64 through metal wires 71. Thereafter, prior to resin sealing, a masking resin tape 75 is adhered to the back face of the lead frame in this embodiment, so that a sealing resin can be prevented from covering the back face of the connecting portion 68 and the projections 66 and 67 formed on the back faces of the inside inner leads 63 and the outside inner leads 64. At this point, since the masking resin tape 75 is required to be removed after the resin sealing, an easily removable material is selected as the material for the masking resin tape 75.

Since the masking resin tape 75 is used for preventing the sealing resin from covering the back face of the connecting portion 68 alone, the masking resin tape 75 is not necessarily stretched over the projections 67 and 68 as far as it covers the back face of the connecting portion 68.

Figure 22:
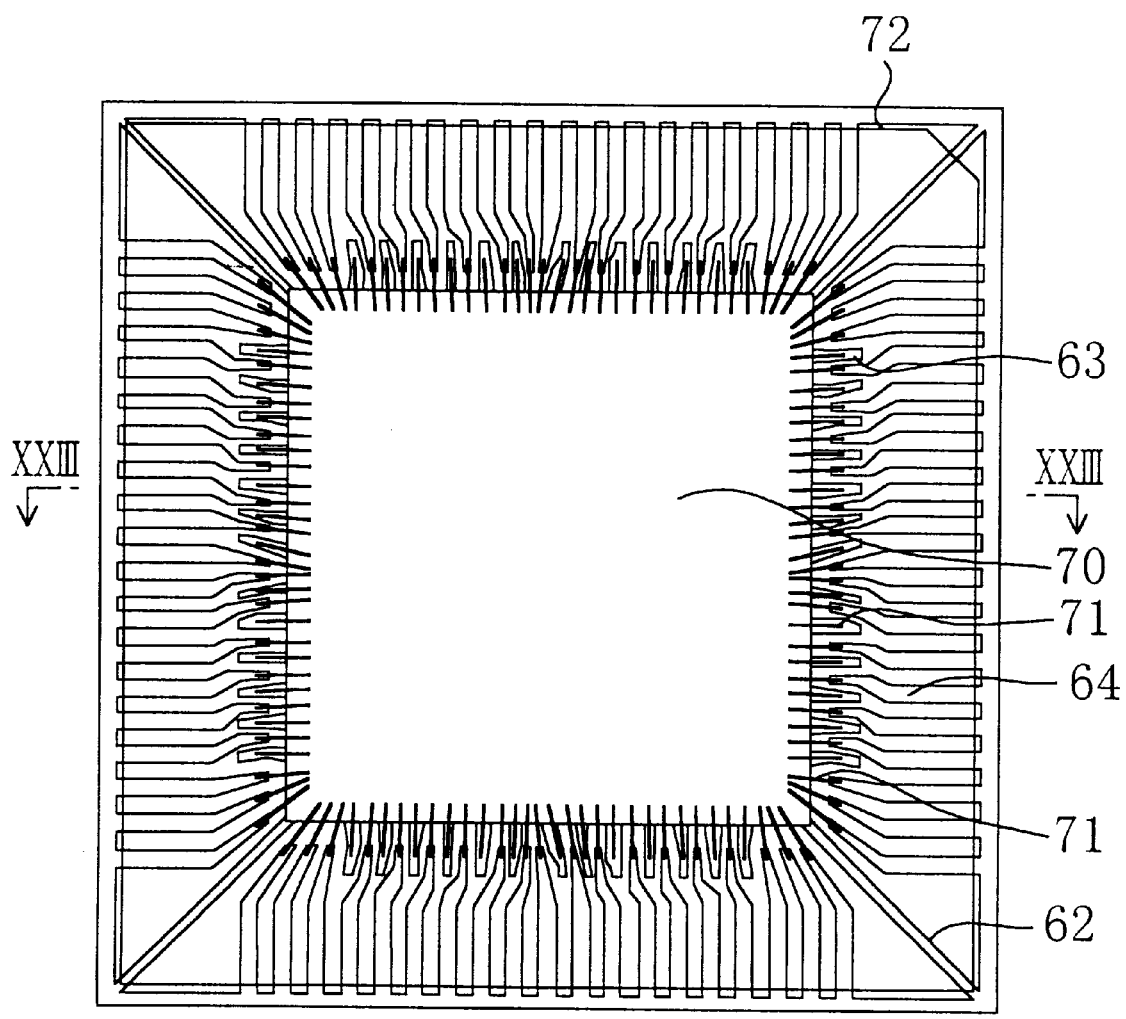
FIG. 22 is a plan view of the semiconductor device sealed with a resin after wire bonding between electrode pads of the semiconductor chip and inside and outside inner leads in the manufacturing procedures for the semiconductor device of the fifth embodiment.
Figure 23:
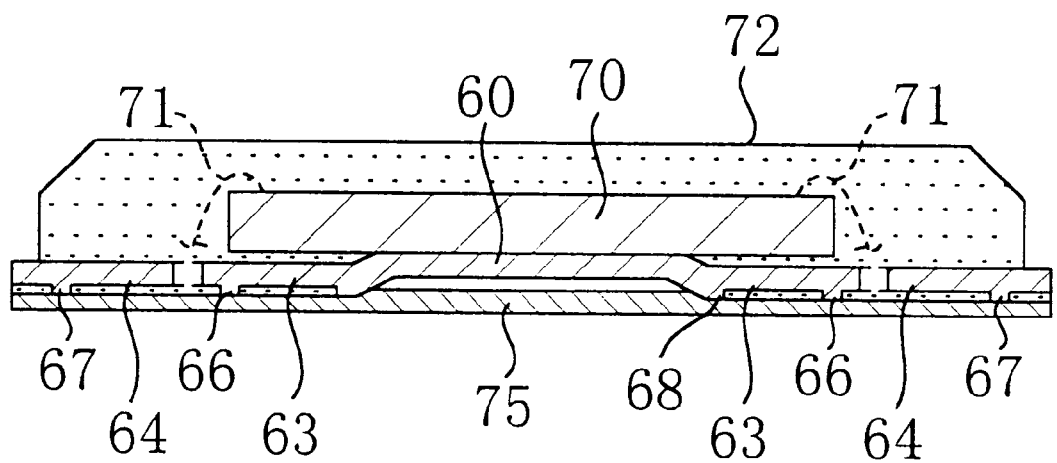
FIG. 23 is a sectional view taken on line XXIII—XXIII of FIG. 22.

Then, as is shown in FIGS. 22 and 23, the die pad 60, the supporting leads 62, the inside inner leads 63, the outside inner leads 64, the semiconductor chip 70 and the metal wires 71 are sealed with a sealing resin 72. FIG. 22 is a plan view where the sealing resin is transparentized and merely the outline thereof is shown so as to reveal the inside, and FIG. 23 is a sectional view taken on line XXIII—XXIII of FIG. 22. At this point, since the masking resin tape 75 masks the projections 66 and 67 and the back face of the connecting portion 68 against the sealing resin, the sealing resin does not cover the projections 66 and 67 and the back face of the connecting portion 68 in the resin sealing. In this embodiment, since the connecting portion 68 is thus masked, the sealing resin does not cover also the back face of the die pad 60.

Figure 24:
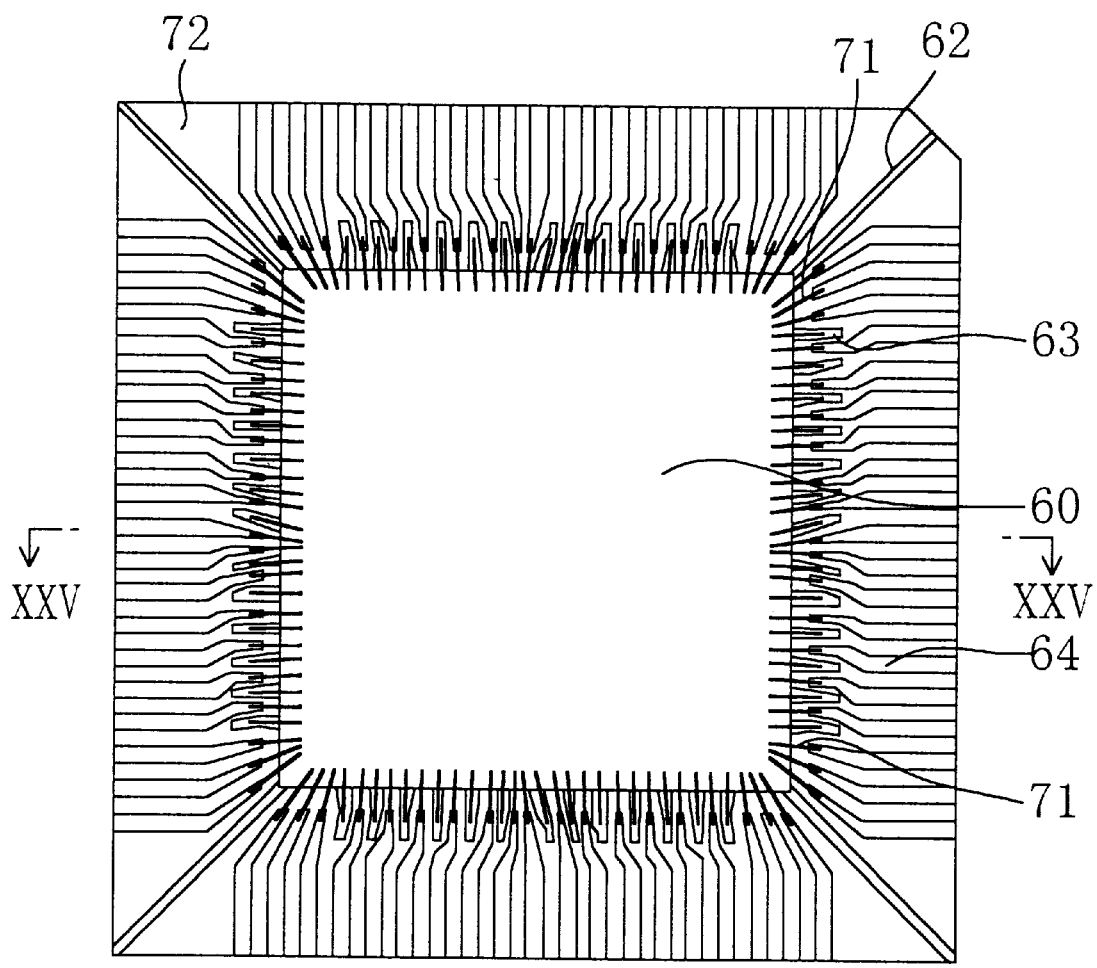
FIG. 24 is a plan view of the semiconductor device where an outer frame is cut off after resin sealing in the manufacturing procedures for the semiconductor device of the fifth embodiment, with a sealing resin shown as a transparent substance.
Figure 25:
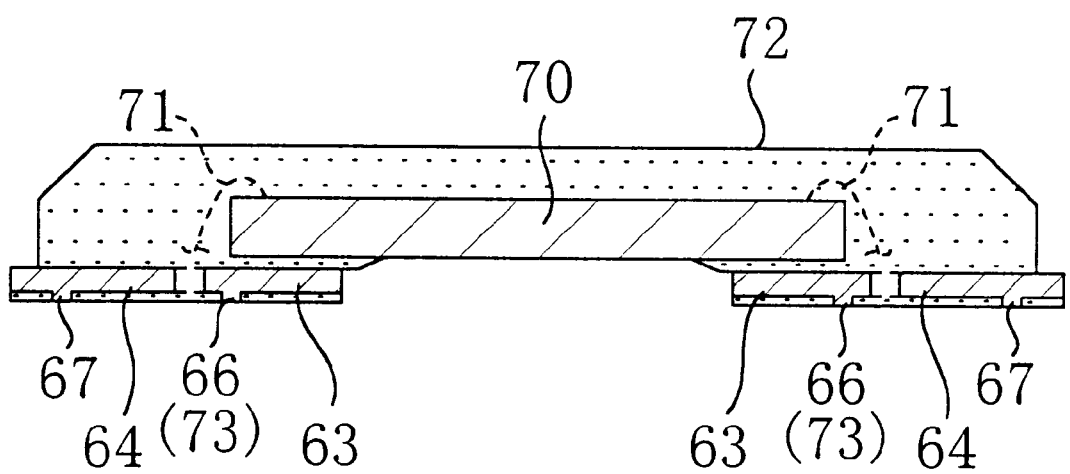
FIG. 25 is a sectional view taken on line XXV—XXV of FIG. 24.

Next, as is shown in FIGS. 24 and 25, portions of the supporting leads 62 and the outside inner leads 64 closer to the outer frame 61 are cut off, thereby removing the outer frame 61. Furthermore, the masking resin tape 75 is removed, and the lead frame is cut with a laser along the connecting portion 68 between the inside inner leads 63 and the die pad 60, so as to remove an area at inside of the connecting portion 68 including the die pad 60. This removal can be carried out with ease by using, for example, a laser generally used for laser marking. FIG. 24 is a plan view wherein the sealing resin is transparentized and merely the outline thereof is shown so as to reveal the inside, and FIG. 25 is a sectional view taken on line XXV—XXV of FIG. 24. In this manner, the inside inner leads 63, which have been connected with one another through the die pad 60, can be made independent of one another. Thus, the semiconductor device can be completed. As a result of the removal of the die pad 60, the back face of the semiconductor chip 70 is exposed in this semiconductor device. Furthermore, although not shown in the drawings, the projections 66 of the inside inner leads 63 and the projections 67 of the outside inner leads 64 are exposed on the bottom of the semiconductor device as is shown in FIG. 13 after removing the masking resin tape 75 also in this embodiment. Thus, the exposed bottoms of the projections 66 and 67 disposed in a zig-zag manner actually work as external terminals 73 arranged in the shape of a grid.

In this embodiment, the back face of the connecting portion 68 between the inside inner leads 63 and the die pad 60 is not half-etched so as to be placed at the same level as the projections 66 and 67 of the inner leads 63 and 64, and the resin sealing is conducted after masking the back face of the connecting portion 68 with the masking resin tape 75. Then, the lead frame is cut along the connecting portion 68. Therefore, the inside inner leads 63 and the outside inner leads 64 can be separated from one another without using an insulator. In other words, without using an insulator, a semiconductor device which can exhibit the same effects as the semiconductor device of the fourth embodiment can be obtained in this embodiment.

In addition, in the resin sealing of this embodiment, the projections 66 of the inside inner leads 63 and the projections 67 of the outside inner leads 64 are masked with the masking resin tape 75 so as to prevent the sealing resin from covering the projections 66 and 67. Therefore, the projections 66 and 67 can be definitely exposed out of the sealing resin 72. As a result, when solder balls are provided to the external terminals 73 afterwards as is shown in FIG. 14, the reliability in electrical connection can be advantageously improved.

In this embodiment, the sealing resin 72 is prevented from covering the back face of the die pad 60. However, the sealing resin can be introduced also below the die pad 60 by providing a nick to a portion inclined due to the depression in a state shown in FIG. 19 or by half-etching a part of the back face of the connecting portion 68 excluding a portion continuous with the inside inner leads 63. In such a case, a part of the connecting portion 68 exposed out of the sealing resin (namely, the entire or a part of the connecting portion 68) is cut off with a laser with the die pad 60 remaining, and the inside inner leads 63 can be separated from the die pad 60 and can be independent of one another.

Also, it is not always necessary to make the die pad 60 set up against the inner leads 63 and 64, but the entire area at inside of the connecting portion 68 including the die pad 60 can be covered with the masking resin tape 75 without conducting the half-etching on this area. In this case, when the semiconductor chip 70 has a rather large size, the semiconductor chip 70 is supported also by the inside inner leads 63, and a level difference between the electrode pads of the semiconductor chip 70 and the inner leads 63 and 64 can be advantageously made small.

The lead frame including both the inside inner leads 63 and the outside inner leads 64 is used in this embodiment, but a lead frame including a single type of inner leads, that is, the inside inner leads alone, as described in the second embodiment (whereas excluding an insulator) can be also used in this embodiment. In this case, a very compact semiconductor device free from burrs can be provided.

Also, the outside inner leads can be separated from the outer frame so as to be supported by the insulator as described in the third embodiment, and the inside inner leads can be cut off with a laser after the resin sealing as described in this embodiment. In such a case, a semiconductor device with a high density free from burrs can be provided.

Furthermore, the connecting portion 68 is covered with the masking resin tape 75 before the resin sealing so as to definitely prevent the sealing resin from covering the back face of the connecting portion 68 in this embodiment. However, the masking resin tape is not always necessary as far as the bottom of the connecting portion 68 can be accurately made to come in contact with a die for molding. Also in such a case, differently from the first through fourth embodiments, the inside inner leads can be separated from the outside inner leads and can be independent of one another without using an insulator.

Other Embodiments

The structure excluding an insulator as described in the fifth embodiment can be realized also through the following manufacturing procedures: For example, in the first embodiment, a part of each inside inner lead 23 of the lead frame is bonded with the semiconductor chip 30 with an adhesive without using the insulator 25. Then, the resultant lead frame is cut along a portion at inside of the adhered portions with a laser or the like from the back face. Thus, the inside inner leads 23 can be supported by the supporting leads 22 through the semiconductor chip 30 and can be independent of one another. Thereafter, a structure basically the same as that of the fifth embodiment can be realized through the procedures for wire bonding, resin sealing and cutting. However, in this case, the semiconductor chip 30 is not set up against the inner leads 23 and 24.

Such a structure is applicable also to a case where the single type of inner leads are used without using the outside inner leads (as is shown in FIG. 8) and to a case where the outside inner leads are separated from the outer frame and supported by the supporting leads through the insulator.

Now, modification in the section of the inside inner lead and the outside inner lead adoptable in the respective embodiments will be described with reference to FIGS. 26(a) through 26(c).

Figure 26A:
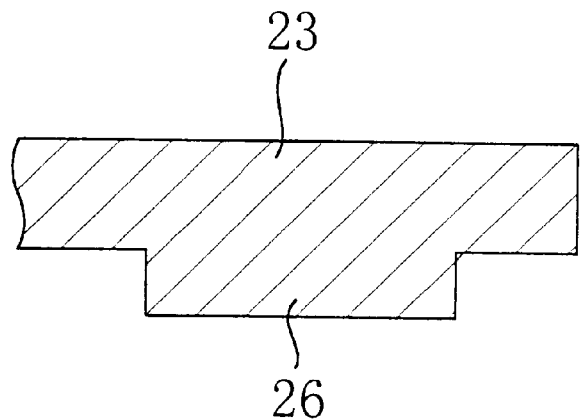
FIGS. 26(a) through 26(c) are sectional views of a projection of an inner lead formed through half-etching, a projection of an inner lead formed by pressing, and an inner lead provided with no projection, respectively adoptable in the respective embodiments.

FIG. 26(a) is a sectional view for showing the shape of the inside inner lead 23 in the vicinity of the projection 26 adoptable in the lead frames of the aforementioned embodiments. When this structure is adopted, the projection 26 can be formed through the half-etching on the back face with an area for the projection 26 masked.

Figure 26B:
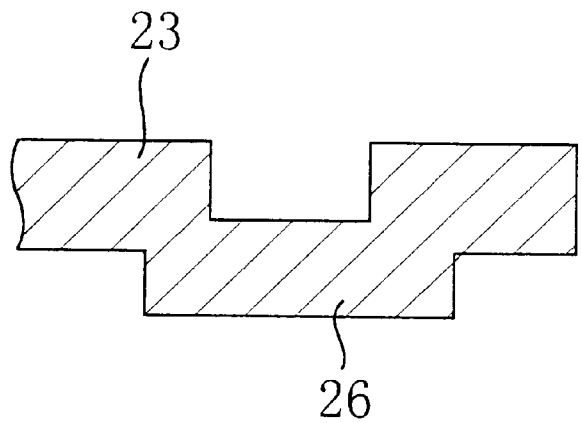

FIG. 26(b) is a sectional view for showing the projection 26 formed by pressing the end of the inside inner lead 23 of the lead frame. This structure is advantageous in a large power of the sealing resin for holding the inside inner leads 23, but in contrast, this structure cannot always provide sufficient accuracy in the height of the respective projections 26. However, when the projections 26 are covered with the masking resin tape before the resin sealing as described in the fifth embodiment, this disadvantage can be overcome. This also applies to the structure of the projections of the outside inner leads.

Figure 26C:
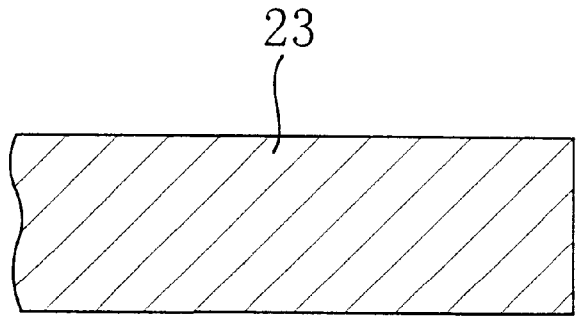
Figure 27:
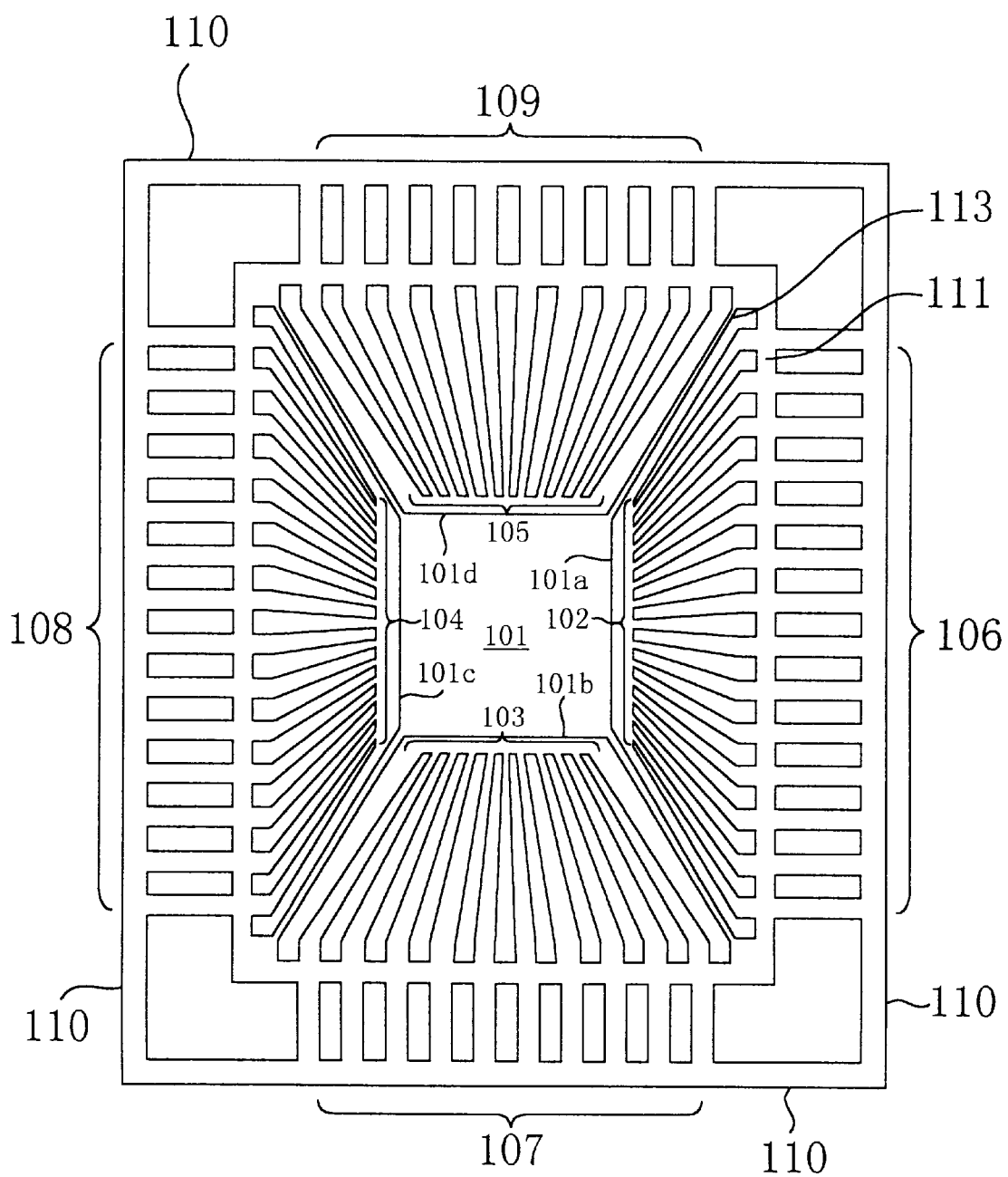
FIG. 27 is a top view for showing the structure of a conventional lead frame.
Figure 28A:
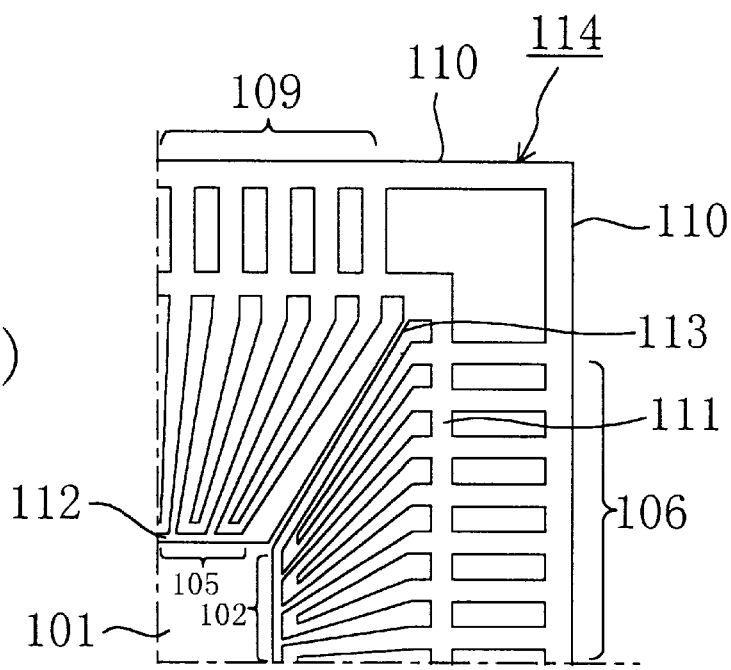
FIGS. 28(a) and 28(b) are partial plan views of merely an upper right portion of a lead frame body formed through etching or pressing a metal plate in manufacturing procedures for the conventional lead frame and of the lead frame obtained by removing a connecting portion between inner leads and a die pad.
Figure 28B:
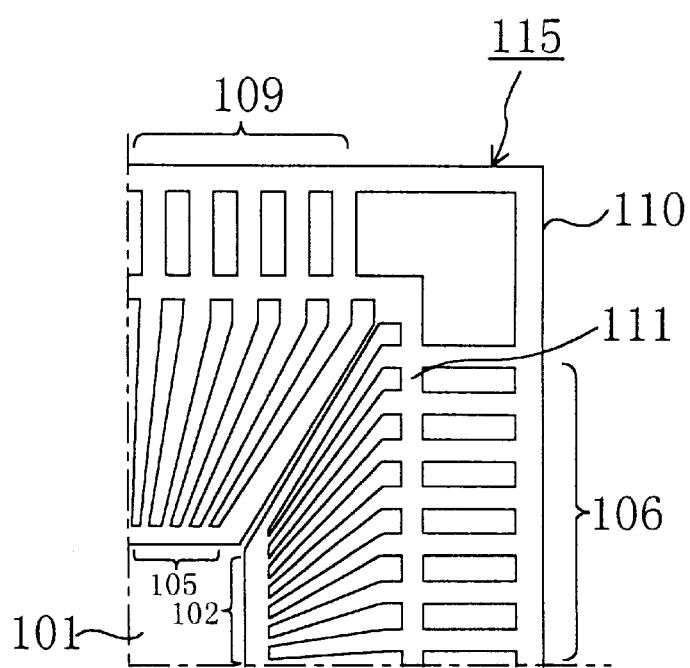
Figure 29:
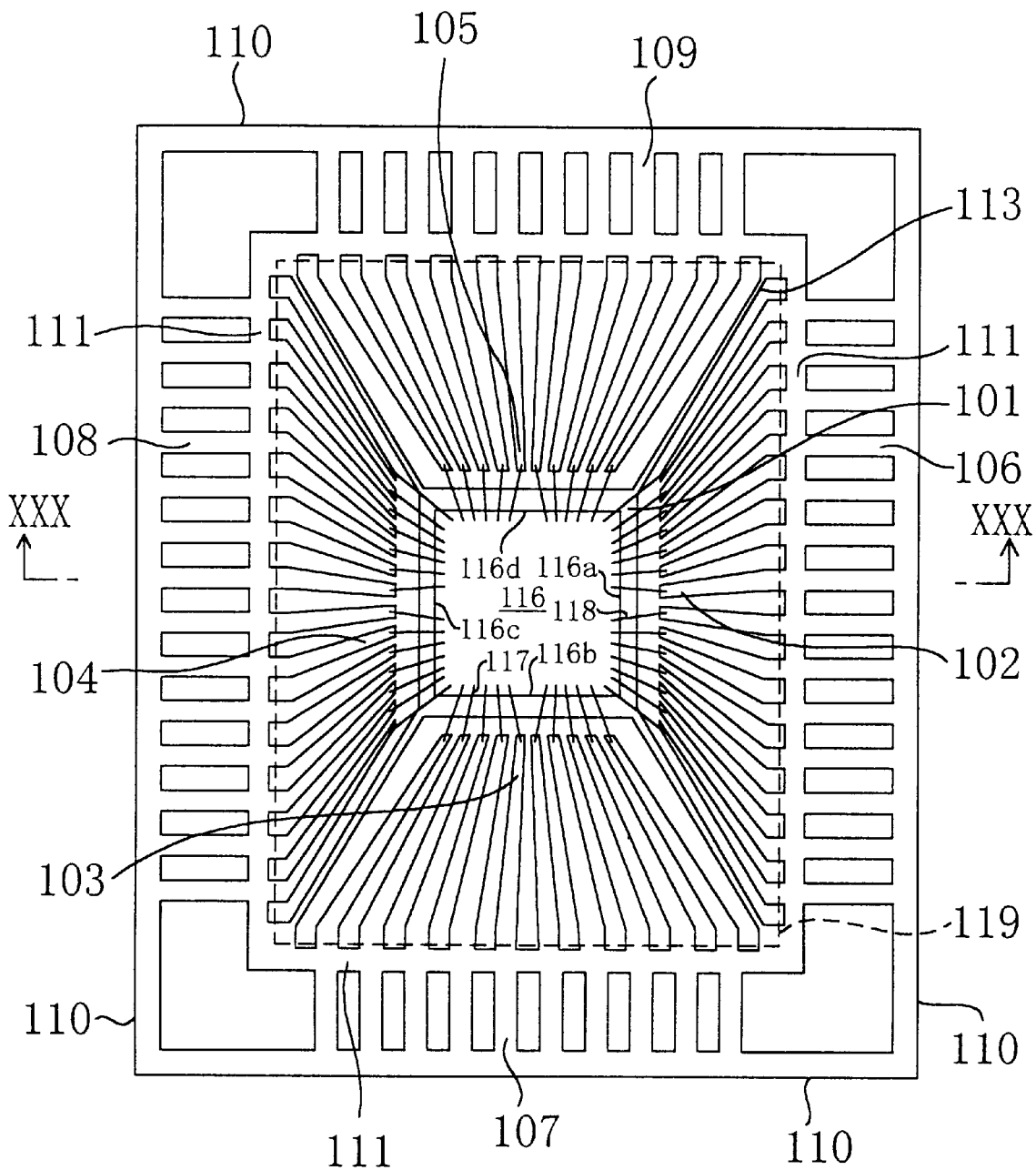
FIG. 29 is a plan view of a conventional semiconductor device with a sealing resin shown as a transparent substance.

FIG. 26(c) is a sectional view of an inside inner lead 23 having no projection but a flat bottom face. Even when the inside inner lead has such a structure, the electric connection with a mother substrate can be attained as far as the back faces of the inside inner leads 23 are exposed out of the sealing resin. However, when solder balls are provided to the inner leads, the projections are preferably formed through the half-etching, pressing or the like.

What is claimed is:

1. A lead frame for use in manufacturing a semiconductor device including a semiconductor chip, comprising:
    an outer frame;
    supporting leads connected with said outer frame;
    inside inner leads which are independent of one another, whose tips are disposed within or in the vicinity of an area for said semiconductor chip and whose ends are disposed at outside of said area for said semiconductor chip and are separated from said outer frame; and
    an insulator fixed on top faces of said supporting leads and said inside inner leads,
    wherein said inside inner leads are supported by said supporting leads through said insulator.

2. The lead frame of claim 1,
    wherein each of said inside inner leads is provided, on a back face thereof, a projection to be used as an external terminal.

3. The lead frame of claim 1,
    wherein outside inner leads, whose tips are separated from the ends of said inside inner leads, are disposed between said inside inner leads and said outer frame.

4. The lead frame of claim 1,
    wherein an area at inside of the tips of said inside inner leads is open.

5. The lead frame of claim 1,
    wherein each of said supporting leads extends from one portion of said outer frame to be connected with another portion of said outer frame.

6. The lead frame of claim 1, wherein a die pad, which is set up against said inside inner leads, is disposed at inside of said inside inner leads, and
    tips of said supporting leads are connected with said die pad.

7. The lead frame of claim 2,
    wherein said projections of said inside inner leads have bottoms arranged in plural lines on a plane.

8. The lead frame of claim 3,
    wherein ends of said outside inner leads are connected with said outer frame.

9. The lead frame of claim 3,
    wherein the ends of said outside inner leads are separated from said outer frame, and
    said lead frame is further provided with an outside insulator fixed on top faces of said supporting leads and said outside inner leads.

10. The lead frame of claim 3,
    wherein the ends of said inside inner leads and the tips of said outside inner leads are interposed between one another and disposed substantially alternately.

11. The lead frame of claim 3, wherein each of said outside inner leads is provided, on a back face thereof, a projection to be used as an external terminal.

12. The lead frame of claim 11, wherein said projections of said outside inner leads have bottoms arranged in a plurality of lines on a plane.

13. A semiconductor device comprising:

a semiconductor chip including electrode pads;

inside inner leads which are separated from one another, whose tips are disposed within or in the vicinity of an area for said semiconductor chip and whose ends are disposed at outside of said area for said semiconductor chip;

supporting leads for supporting said inside inner leads;

an insulator fixed on a part of each of said supporting leads and a part of each of said inside inner leads;

metal wires for electrically connecting said electrode pads of said semiconductor chip with the ends of said inside inner leads; and a sealing resin for sealing said semiconductor chip, said inside inner leads, said supporting leads, said insulator and said metal wires, wherein side-faces and top faces of the tips and side-faces and top faces of the ends of said inside inner leads are buried in said sealing resin and each of said supporting leads extends to a side face of said sealing resin, and at least a part of a back face of each of said inside inner leads is not covered with said sealing resin but exposed to work as an external terminal.

14. The semiconductor device of claim 13, wherein a tip of each of said supporting leads is cut off at a position at inside of a portion where said insulator is fixed, and said semiconductor chip is mounted on said insulator.

15. The semiconductor device of claim 13, wherein each of said supporting leads extends from one portion of said outer frame to be connected with another portion of said outer frame.

16. The semiconductor device of claim 13, wherein a die pad, which is set up against said inside inner leads, is formed at inside of said inside inner leads, tips of said supporting leads are connected with said die pad, and said semiconductor chip is mounted on said die pad.

17. The semiconductor device of claim 13, wherein each of said inside inner leads is provided, on a back face thereof, with a projection, said exposed part of the back face of each of said inside inner leads corresponds to a bottom of said projection, and said projections of said inside inner leads have the bottoms arranged in a plurality of lines on a plane.

18. The semiconductor device of claim 13, wherein outside inner leads whose tips are separated from the ends of said inside inner leads are interposed between said inside inner leads and said outer frame, at least a part of a back face of each of said outside inner leads is not covered with said sealing resin but exposed, and said semiconductor device is further provided with metal wires for electrically connecting the tips of said outside inner leads with said electrode pads of said semiconductor chip.

19. The semiconductor device of claim 17, wherein the exposed bottoms of said projections are provided with ball electrodes.

20. The semiconductor device of claim 18, wherein the ends of said outside inner leads are buried in said sealing resin, and said semiconductor device is further provided with an outside insulator fixed on top faces of said supporting leads and said outside inner leads.

21. The semiconductor device of claim 18, wherein the end of each of said outside inner leads extends to a side face of said sealing resin.

22. The semiconductor device of claim 18, wherein the ends of said inside inner leads and the tips of said outside inner leads are interposed between one another and disposed substantially alternately.

23. The semiconductor device of claim 18, wherein each of said outside inner leads is provided, on a back face thereof, with a projection, the exposed part of the back face of each of said outside inner leads corresponds to a bottom of said projection, and said projections of said outside inner leads have the bottoms arranged in a plurality of lines on a plane.

24. The semiconductor device of claim 18, wherein the exposed bottoms of said projections are provided with ball electrodes.

25. A semiconductor device comprising:

a semiconductor chip including electrode pads;

inside inner leads which are separated from one another, whose tips are disposed within an area for said semiconductor chip and whose ends are disposed at outside of said area for said semiconductor chip;

supporting leads for supporting said inside inner leads;

metal wires for electrically connecting said electrode pads of said semiconductor chip with the ends of said inside inner leads; and a sealing resin for sealing said semiconductor chip, said inside inner leads, said supporting leads and said metal wires, wherein side faces and top faces of the tips and side-faces and top faces of the ends of said inside inner leads are buried in said sealing resin and each of said supporting leads extends to a side face of said sealing resin, at least a part of back face of each of said inside inner leads is not covered with said sealing resin but exposed, and said semiconductor chip is mounted on a part of said inside inner leads excluding the ends thereof.

26. The semiconductor device of claim 25, wherein outside inner leads whose tips are separated from the ends of said inside inner leads are interposed between said inside inner leads and said outer frame, at least a part of a back face of each of said outside inner leads is not covered with said sealing resin but exposed, and said semiconductor device is further provided with metal wires for electrically connecting the tips of said outside inner leads with said electrode pads of said semiconductor chip.

27. The semiconductor device of claim 26, wherein the ends of said inside inner leads and the tips of said outside inner leads are interposed between one another and disposed substantially alternately.

* * * * *